(12) United States Patent
Ohnishi

(10) Patent No.: US 7,868,702 B2
(45) Date of Patent: Jan. 11, 2011

(54) PHOTORECEIVER/AMPLIFIER CIRCUIT, OPTICAL PICKUP DEVICE, AND OPTICAL DISK DEVICE

(75) Inventor: Masaya Ohnishi, Kitakatsuragi-gun (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 592 days.

(21) Appl. No.: 11/861,819

(22) Filed: Sep. 26, 2007

(65) Prior Publication Data

US 2008/0074198 A1    Mar. 27, 2008

(30) Foreign Application Priority Data

Sep. 27, 2006  (JP) ............... 2006-263542
Jul. 10, 2007  (JP) ............... 2007-181433

(51) Int. Cl.
*H03F 3/08* (2006.01)
(52) U.S. Cl. ..................................... 330/308
(58) Field of Classification Search .......... 330/308; 250/214 A, 214 AG
See application file for complete search history.

(56) References Cited

U.S. PATENT DOCUMENTS 7,259,631 B2 * 8/2007 Kiji .................. 330/308
7,514,665 B2 * 4/2009 Murao et al. ........... 250/214 A
2002/0011878 A1  1/2002 Kadowaki
2006/0006312 A1  1/2006 Kiji

FOREIGN PATENT DOCUMENTS

| JP | 57-155810 | 9/1982 |
| JP | 10-135747 | 5/1998 |
| JP | 11-296892 | 10/1999 |
| JP | 2002-83440 | 3/2002 |
| JP | 2005-244864 A | 9/2005 |
| JP | 2006-25377 | 1/2006 |

* cited by examiner

*Primary Examiner*—Khanh V Nguyen
(74) *Attorney, Agent, or Firm*—Morrison & Foerster LLP

(57) ABSTRACT

The subject invention provides a photoreceiver/amplifier circuit comprising a differential circuit including a differential transistor pair and a bias circuit; an active load; a feedback resistor for converting a photocurrent generated from a photodiode into a voltage; a reference resistor; and a compensation circuit. The resistance of the feedback resistor is greater than the resistance of the reference resistor. The compensation circuit supplies a compensation current from a junction between the feedback resistor and a non-inverting input terminal of the differential amplifier circuit, so as to cancel the difference between a voltage between terminals of the feedback resistor and a voltage between terminals of the reference resistor. This reduces noise and improves offset voltage characteristics. The present invention provides a photoreceiver/amplifier circuit ensuring noise reduction and desirable offset voltage characteristics.

10 Claims, 26 Drawing Sheets

PHOTORECEIVER/AMPLIFIER CIRCUIT, OPTICAL PICKUP DEVICE, AND OPTICAL DISK DEVICE

This Nonprovisional application claims priority under 35 U.S.C. §119(a) on Patent Application No. 2006/263542 filed in Japan on Sep. 27, 2006, and Patent Application No. 2007/181433 filed in Japan on Jul. 10, 2007, the entire contents of which are hereby incorporated by reference.

FIELD OF THE INVENTION

The present invention relates to a photoreceiver/amplifier circuit added to an optical receiver mounted to an optical pickup device which performs reproduction/recording of optical disks, particularly to a photoreceiver/amplifier circuit for amplifying a photocurrent signal from the optical receiver and converting it into a voltage. The present invention also relates to an optical disk device and an optical pickup device including the photoreceiver/amplifier circuit.

BACKGROUND OF THE INVENTION

Optical disks including DVDs and CDs are widely used as media for recording music, pictures, data information etc. Reproduction and recording of information from/to the media are carried out by optical pickups. Optical pickups are under development to be further miniaturized and improved in performance.

An optical pickup includes an optical receiver for receiving reflection light from optical disks. Recent optical receivers tend to include less number of components due to cost reduction and use more speedy transmission signals, and therefore the receivable amount of signal light quantity of the optical receiver is decreasing. Therefore, noise reduction is important and indispensable factor in the development of optical receivers.

Further, with the recent popularization of DVDs, optical pickups compatible both with DVD and CD are under development in order to reduce cost for optical pickups. This kind of optical pickups is required to process both laser light for DVD 650 nm in wavelength, and laser light for CD 780 nm in wavelength. Therefore, noise reduction is also an indispensable factor for the optical receiver used for such a pickup.

In an optical pickup device compatible with writing discs like CD±R, CD±RW, DVD±R, DVD±RW which are now widely used, signal reproduction and signal recording (writing) are carried out by different laser powers, and the signal light quantity emitted to the optical receiver varies. In this view, the optical pickup device normally switches the gain of photoreceiver device according to the condition of reproduction/recording. Noise reduction is also an important factor for the optical receiver used for such a pickup.

FIG. 16 shows structures of photodiodes PDA to PDF serving as optical receivers of an optical pickup compatible with a single wavelength. FIG. 17 shows a structure of photoreceiver/amplifier circuits 101a to 101d respectively including the photodiodes PDA to PDE. FIG. 18 shows a detailed structure of the photoreceiver/amplifier circuit 101a.

Based on FIGS. 16 and 18, the following explains a basic operation principle of the photoreceiver/amplifier circuits 101a to 101d, an offset voltage characteristic which is their main characteristic, and a noise reduction method for an amplifier circuit.

As shown in FIG. 16, the square-shaped photodiodes PDA to PDD are adjacently provided to generate RF signals and focus error signals. The rectangle photodiodes PDF and PDE are provided on both sides of the photodiodes PDA to PDD to generate tracking error signals. The photodiodes PDF and PDE outputs signal voltages Ve and Vf, respectively.

The photodiodes PDA to PDD are each connected to a differential amplifier circuit AMP101 of a corresponding one of the photoreceiver/amplifier circuits 101a to 101d. Signal voltages VA to VD outputted from the photoreceiver/amplifier circuits 101a to 101d are processed according to the following calculations by a processor IC in a following stage, to become an RF signal, a focus error signal and a tracking error signal. Therefore, it is important to ensure accuracy of voltage outputs among the photoreceiver/amplifier circuits 101a to 101d. As to the signal voltages VA to VD, it is important to ensure the S/N characteristic as they are used for generation of RF signals.

$$\text{RF signal} = Va+Vb+Vc+Vd \quad (1)$$

$$\text{Focus error signal} = Va+Vc-(Vb+Vd) \quad (2)$$

$$\text{Tracking error signal} = Ve-Vf \quad (3)$$

The following describes the photoreceiver/amplifier circuit 101a including the photodiode PDA to explain one example of operation principle of signal current-voltage conversion.

A signal beam is emitted to the photodiode PDA, and a photocurrent Ia is generated. The photocurrent Ia is converted to a voltage by a gain resistor R1 photoreceiver/amplifier circuit 101a, and appears in an output terminal as an output voltage Von with respect to signal beam emission. Assuming that the output voltage appearing in an output terminal under no signal emission condition is expressed as Vod, a signal voltage Vsig generated by a signal incident on the photodiode PDA is denoted by the following formula.

$$Vsig=Von-Vod \quad (4)$$

The output Von is expressed as follows, $$Von=R1 \times Ia+Vref \quad (5)$$

where Ia expresses photocurrent, and R1 expresses gain resistance.

Vref is a reference power supply voltage, which is externally supplied.

The signal Vod is expressed as follows, $$Vod=Vref-R2 \times Ib2-VBE2+VBE1+R1 \times Ib1 \quad (6)$$

where Ib1 and Ib2 express base currents of transistors Tr101 and Tr102 under no signal input condition, VBE1 and VBE2 express respective voltages between bass-emitter of Tr101 and Tr102, and R2 expresses a resistance of a reference resistor R2.

Accordingly, the signal voltage Vsig is expressed as follows.

$$Vsig=R1 \times Ia-(-R2 \times Ib2-VBE2+VBE1+R1 \times Ib1) \quad (7)$$

In Formula (7), the second term and later is an error.

In the photoreceiver/amplifier circuit, it is important to ensure high accuracy of processing signal of the focus signal denoted by Formula (2), and therefore a decrease in accuracy of processing signal due to the error (offset voltage) becomes an issue. More specifically, it is important to satisfy: Vod≈Vref, which is met by satisfying the following Formulas (8) and (9) under no signal emission condition.

$$R1 \times Ib1 \approx R2 \times Ib2 \quad (8)$$

$$VBE1 \approx VBE2 \quad (9)$$

Assuming that an error of the output voltage Vod with respect to the external reference voltage Vref under no signal emission condition is expressed as an offset voltage Voff, the voltage Voff is denoted by the following Formula (10).

$$Voff = Vod - Vref \quad (10)$$

The offset voltage in the photoreceiver/amplifier circuit has to fall within an accuracy level of ±15 mV. To meet this requirement, according to Formula (8), it is necessary to equalize the resistor of the reference resistor R2 and the resistor of the gain resistor R1 in the conventional photoreceiver/amplifier circuit.

Suppression of noise characteristic is generally an important factor in the photoreceiver/amplifier circuit. The "noise" here indicates noise under no signal input condition, which is generated in components constituting the circuit, mainly in the transistor and the resistor. When a voltage signal resulted from a signal beam is sufficiently large in the photoreceiver/amplifier circuit, the difference between the signal voltage and the noise level is large, in other words, a desirable S/N characteristic is ensured. However, as described, with the recent decrease in signal light quantity, noise reduction in the receiver circuit is indispensable.

With reference to the photoreceiver/amplifier circuit 101a of FIG. 18, the following explains a method of reducing the noise in the photoreceiver/amplifier circuit, which is an important factor of a photoreceiver/amplifier circuit.

An output noise level Vn of the photoreceiver/amplifier circuit 101a is expressed as follows, $$Vn = \sqrt{(Ni1^2 + Ni2^2 + Nr1^2 + Nr2^2)} \quad (11)$$

where Ni1 and Ni2 indicate noise caused by shot-noise generated in the transistors Tr101 and Tr102, and Nr1 and Nr2 indicate noise caused by thermal noise generated in the resistors R1 and R2. Vn is a square mean value of the noise generated in each component. If the bias currents of transistors Tr101 and Tr102 are greatly reduced, the shot-noise of the Ni1 and Ni2 will be reduced. However, to ensure the response characteristic of the photoreceiver/amplifier circuit 101a, the driving current cannot be extremely reduced. Further, the gain resistor R1 cannot be reduced, as it is required to have a predetermined resistance. The only way of reducing noise is setting only the resistance value of the reference resistor R2 to meet a relation: R1>>R2. However, as described, the offset voltage characteristic deteriorates in the conventional photoreceiver/amplifier circuit 101a, and therefore the relation R1=R2 has to be met.

Some prior art documents, such as Japanese Laid-Open patent application Tokukaihei 11-296892 (published on Oct. 29, 1999), discloses a structures in which extra thermal noise is generated by the reference resistor R2 in the optical receiver circuit 101a. The thermal noise is expressed as $\sqrt{(4kTR2\Delta f)}$, where k expresses Boltzmann constant, T expresses absolute temperature, and $\Delta f$ expresses noise bandwidth. This publication teaches a method of integrating the thermal noise by a resistor and a capacitor so as to reduce the thermal noise. The photoreceiver/amplifier circuit 101a includes a capacitor C1 between a node of the reference resistor R2 and the base of the transistor Tr102 and the GND, so as to provide a fixed potential (GND potential) to the reference resistor R2. With such a capacitor C1, the reference resistor R2 and the capacitor C1 form a filter for integrating noise, and radio-frequency noise can be reduced.

FIG. 19 shows structures of photodiodes PDA to PDF, and PDa to PDd used as optical receivers for the optical pickup compatible with two wavelengths. FIG. 20 shows structures of photoreceiver/amplifier circuit 101A to 101D including the photodiodes PDA to PDF, and PDa to PDd. Further, FIG. 21 shows a detailed structure of the photoreceiver/amplifier circuit 101A.

As shown in FIG. 19, the photodiode PDA to PDD, and photodiode PDa to PDd are adjacently provided between the photodiodes PDE and PDF, along the longitudinal direction of the photodiodes PDE and PDF. The photodiodes PDA to PDD correspond to the first wavelength (eg. CD), and the photodiodes PDa to PDd correspond to the second wavelength (eg. DVD).

As shown in FIGS. 20 and 21 (showing only the photodiodes PDA and PDa), the photodiodes PDA to PDD are each connected to a differential amplifier circuit AMP111 of a corresponding one of the photoreceiver/amplifier circuits 101A to 101D, and the photodiodes PDa to PDd are also each connected to a differential amplifier circuit AMP111 of a corresponding one of the photoreceiver/amplifier circuits 101A to 101D. The differential amplifier circuit AMP111 includes a differential circuit DEF1 including transistors Tr101 and Tr102 and a bias circuit I1; and a differential circuit DEF2 including transistors Tr103 and Tr104 and a bias circuit I2. In the differential circuit DEF1, the gain resistor R1, the reference resistor R2 and the photodiode PDA are connected. In the differential circuit DEF2, the gain resistor R3, the reference resistor R4, and the photodiode PDa are connected. The active load circuit AL is a common circuit for the two differential circuits DEF1 and DEF2.

The capacitor C1 is connected between a node of the reference resistor R2 and the base of the transistor Tr102 and the GND, so as to provide a fixed potential (GND potential) to the reference resistor R2. Meanwhile, The capacitor C2 is connected between a node of the reference resistor R4 and the base of the transistor Tr104 and the GND, so as to provide a fixed potential (GND potential) to the reference resistor R4.

Further, the operation of one of the bias circuits I1 and I2 in the differential circuits DEF1 and DEF2 is controlled by a selecting signal SEL externally supplied. In this manner, the operation of one of the differential circuits DEF1 and DEF2 is controlled according to the wavelength of input signal. Also, the photodiode PDA, the gain resistor R1 and reference resistor R2, the photodiode PPDa, the gain resistor R3 and the reference resistor R4 are selectively brought into operation according to which of the differential circuit DEF1 and the DEF2 is in operation.

FIG. 22 shows structures of photoreceiver/amplifier circuit 101AA to 101DD used in an optical pickup which uses photodiodes PDA to PDF of FIG. 16 as optical receivers compatible with 1 wavelength and two kinds of signal light quantity on reproduction and recording. FIG. 23 shows a detailed structure of the photoreceiver/amplifier circuit 101AA.

As shown in FIGS. 22 and 23 (showing only the photodiode PDA), photodiodes PDA to PDD are each connected to a differential amplifier circuit AMP121 of a corresponding one of the photoreceiver/amplifier circuits 101AA to 101DD. As with the differential amplifier circuit AMP101, the differential amplifier circuits AMP121 includes a differential circuit having the transistors Tr101 and Tr102. Also, in addition to the gain resistor R1 and the reference resistor R2, the differential amplifier circuit AMP121 has a gain resistor R5 and a reference resistor R6, which are provided in parallel with the gain resistor R1 and the reference resistor R2, respectively. The gain resistor R5 is conducted in parallel to the gain resistor R1 when the switch SW101 formed of a PNP transistor is turned on. The reference resistor R6 is conducted in parallel to the gain resistor R2 when the switch SW102 formed of a PNP transistor is turned on.

Assuming that the resistances of the gain resistors R1 and R5 are expressed as R1 and R5, respectively, the relationship between the two resistances is expressed as follows.

$$R1 > R5 \quad (12)$$

On reproduction of signals, the signal light quantity is small and a high gain is required. The switch SW101 is therefore turned off. Consequently, only the gain resistor R1 is driven, and the reproduction signal undergoes I-V conversion. On recording of signals, the signal light quantity is large and a low gain is required to prevent circuit saturation caused by a signal of large light quantity. Therefore, the SW101 is turned on when signals are written, and the gain resistors R1 and R5 are driven. The gain Gon at this stage is expressed as follows.

$$Gon = R1 \times R5/(R1+R5) \quad (13)$$

Note that, the ON resistance of a PNP transistor constituting a switch SW101 is not taken into account.

The method disclosed in the foregoing publication achieves reduction of radio-frequency noise; however, to sufficiently reduce noise in the low-frequency band, the capacitor C1 needs to have a maximum capacitance in the photoreceiver/amplifier circuit 101a of FIG. 18. This is not desirable particularly in terms of cost. In this view, there has been a demand for a noise reduction method as a replacement of the foregoing conventional technique.

Further, as described, the noise reduction is an important factor also in a photoreceiver/amplifier circuit compatible with 2 kinds of wavelength. However, as with the photoreceiver/amplifier circuit 101a of FIG. 17, the conventional photoreceiver/amplifier circuit 101A shown in FIG. 21 requires reference resistors R2 and R4 having the same resistances as those of gain resistors R1 and R3, so as to ensure a desirable offset voltage characteristic. Therefore, the photoreceiver/amplifier circuit 101A of FIG. 21 also has a difficulty in noise reduction.

The condition: R1=R2 needs to be satisfied also in the photoreceiver/amplifier circuit 101AA of FIG. 22 to ensure a desirable offset voltage characteristic. Therefore, when the gain is switched by the switch SW101, the reference resistor is also required to be switched by the switch SW102.

Considering noise in such a photoreceiver/amplifier circuit with a gain switching function, the desirable level of S/N characteristic can be ensured in the writing state because the signal light quantity is large. However, in the signal reproduction, the signal light quantity is small and the influence of noise becomes more significant, and a low noise characteristic is required. More specifically, the photoreceiver/amplifier circuit with a gain switching function needs to have a low noise characteristic according to circumstance.

SUMMARY OF THE INVENTION

An object of the present invention is to provide a photoreceiver/amplifier circuit which ensures noise reduction and desirable offset characteristics.

In order to attain the foregoing object, a first photoreceiver/amplifier circuit according to the present invention comprises: an optical receiver; a feedback resistor; a reference resistor; a differential circuit including a differential transistor pair made up of a first transistor having a base connected to the optical receiver and to the feedback resistor, and a second transistor having a base supplied with an external reference potential via the reference resistor; and a compensation circuit for compensating a difference between voltage between terminals of the feedback resistor and a voltage between terminals of the reference resistor, wherein: a resistance of the feedback resistor is greater than a resistance of the reference resistor.

With this arrangement in which a resistance of the feedback resistor is greater than a resistance of the reference resistor, the noise from a low-frequency band can be securely reduced. Besides, since the compensation circuit compensates a difference between the voltage between terminals of the feedback resistor and a voltage between terminals of the reference resistor, it is possible to prevent an offset voltage caused by the difference between the resistance of the feedback resistor and the resistance of the reference resistor.

The foregoing laid-open patent publication suggests a photoreceiver/amplifier circuit where the gain resistor=offset adjustment resistor/n. The photoreceiver/amplifier circuit includes an offset adjustment circuit formed as a differential circuit controlled by a n-times driving current. With this structure, photoreceiver/amplifier circuit achieves noise reduction. In contrast, the photoreceiver/amplifier circuit according to the present invention suppresses an offset voltage by compensating a difference between a voltage between terminals of the feedback resistor and a voltage between terminals of the reference resistor. Therefore, a bias current in the differential transistor pair of the differential circuit is constant, and no additional noise occurs. On the other hand, the photoreceiver/amplifier circuit disclosed in the foregoing laid-open patent publication increases a transistor shot-noise by using a n-times bias current of the controlling the offset adjustment circuit. The noise assumably increases in this case. Therefore, also in this view, the photoreceiver/amplifier circuit of the present invention ensures more desirable noise characteristic than the conventional photoreceiver/amplifier circuit.

In order to attain the foregoing object, a second photoreceiver/amplifier circuit comprises: a plurality of optical receivers for receiving light beams of different wavelengths; a plurality of feedback resistors corresponding to light beams of different wavelengths; a plurality of reference resistors corresponding to the feedback resistors; a plurality of differential circuits each including a differential transistor pair made up of a corresponding pair of (i) one of a plurality of first transistors each having a base connected to one of the optical receivers and one of the feedback resistors, and (ii) one of a plurality of second transistors each having a base supplied with an external reference potential via one of the reference resistors; a first selecting circuit for selectively driving one of the differential circuits; a plurality of compensating circuits for compensating a difference between a voltage between terminals of each feedback resistor and a voltage between terminals of a corresponding reference resistor; and a second selecting circuit for selectively driving one of the compensating circuits corresponding to a differential circuit selected by the first selecting circuit, wherein: a resistance of each feedback resistor is greater than a resistance of each reference resistor.

With this arrangement in which a resistance of each feedback resistor is greater than a resistance of a corresponding reference resistor, the noise from a low-frequency band can be securely reduced as with the foregoing photoreceiver/amplifier circuit. Besides, as the second selecting circuit selectively driving one of the compensating circuits corresponding to a differential circuit selected by the first selecting circuit, the compensation circuit compensates a difference between the voltage between terminals of the feedback resistor and a voltage between terminals of the reference resistor as with the foregoing photoreceiver/amplifier circuit. Therefore, it is possible to prevent an offset voltage caused by the difference between the resistance of the feedback resistor and the resistance of the reference resistor. Consequently, noise reduction and improvement of offset characteristic can be ensured according to gain switching for each of the plural optical receivers.

In order to attain the foregoing object, a third photoreceiver/amplifier circuit according to the present invention comprises: a plurality of optical receivers for receiving light beams of different wavelengths; a plurality of feedback resistors corresponding to light beams of different wavelengths; a single common reference resistor for the feedback resistors; a plurality of differential circuits each including a differential transistor pair made up of a corresponding pair of (i) one of a plurality of first transistors each having a base connected to one of the optical receivers and one of the feedback resistors, and (ii) one of a plurality of second transistors each having a base supplied with an external reference potential via the reference resistor; a first selecting circuit for selectively driving one of the differential circuits; a plurality of compensating circuits for compensating a difference between a voltage between terminals of each feedback resistor and a voltage between terminals of the reference resistor; and a second selecting circuit for selectively driving one of the compensating circuits corresponding to a differential circuit selected by the first selecting circuit, wherein: a resistance of each feedback resistor is greater than a resistance of the reference resistor.

With this arrangement in which a resistance of each feedback resistor is greater than a resistance of a corresponding reference resistor, the noise from a low-frequency band can be securely reduced as with the foregoing photoreceiver/amplifier circuit. Besides, as the second selecting circuit selectively driving one of the compensating circuits corresponding to a differential circuit selected by the first selecting circuit, the compensation circuit compensates a difference between the voltage between terminals of the feedback resistor and a voltage between terminals of the reference resistor as with the foregoing photoreceiver/amplifier circuit. Therefore, it is possible to prevent an offset voltage caused by the difference between the resistance of the feedback resistor and the resistance of the reference resistor. Consequently, noise reduction and improvement of offset characteristic can be ensured according to gain switching for each of the plural optical receivers.

In order to attain the foregoing object, a fourth photoreceiver/amplifier circuit comprises: a single optical receiver; a plurality of feedback resistors; a single common reference resistor for the feedback resistors; a differential circuit including a differential transistor pair made up of a first transistor having a base connected to the optical receiver and one of the feedback resistors, and a second transistor having a base supplied with an external reference potential via the reference resistor; a first selecting circuit for selectively connecting one of the feedback resistors to the differential circuit; a plurality of compensating circuits for compensating a difference between a voltage between terminals of each feedback resistor and a voltage between terminals of the reference resistor; and a second selecting circuit for selectively driving one of the compensating circuits corresponding to a feedback circuit selected by the first selecting circuit, wherein: a resistance of each feedback resistor is greater than a resistance of the reference resistor.

With this arrangement in which a resistance of each feedback resistor is greater than a resistance of a corresponding reference resistor, the noise from a low-frequency band can be securely reduced as with the foregoing photoreceiver/amplifier circuit. Besides, as the second selecting circuit selectively driving one of the compensating circuits corresponding to a feedback circuit selected by the first selecting circuit, the compensation circuit compensates a difference between the voltage between terminals of the feedback resistor and a voltage between terminals of the reference resistor as with the foregoing photoreceiver/amplifier circuit. Therefore, it is possible to prevent an offset voltage caused by the difference between the resistance of the feedback resistor and the resistance of the reference resistor. Consequently, noise reduction and improvement of offset characteristic can be ensured according to gain switching for each of the plural feedback resistors.

In order to attain the foregoing object, a fifth photoreceiver/amplifier circuit according to the present invention comprises: a plurality of optical receivers for receiving light beams of different wavelengths; a plurality of feedback resistors corresponding to light beams of different wavelengths; a plurality of reference resistors corresponding to the feedback resistors; a plurality of differential circuits each including a differential transistor pair made up of a corresponding pair of (i) one of a plurality of first transistors each having a base connected to one of the optical receivers and one of the feedback resistors, and (ii) one of a plurality of second transistors each having a base supplied with an external reference potential via one of the reference resistors; a selecting circuit for selectively driving one of the differential circuits; a compensating circuit for compensating a difference between a voltage between terminals of each feedback resistor and a voltage between terminals of a corresponding reference resistor, wherein: the compensating circuit has a first resistor provided between an emitter of the first load transistor and a power supply potential, and a second resistor provided between an emitter of the second load transistor and the power supply potential, and the first and second resistors have resistances which are set to values for enabling collector currents of the first and second transistors to compensate a voltage difference derived from a resistance difference between the feedback resistor and the reference resistor, a resistance of each feedback resistor is greater than a resistance of a corresponding reference resistor, and these resistances are set so that the difference between a voltage between terminals of each feedback resistor and a voltage between terminals of a corresponding reference resistor becomes constant.

With this arrangement in which a resistance of each feedback resistor is greater than a resistance of the reference resistor, the noise from a low-frequency band can be securely reduced as with the foregoing photoreceiver/amplifier circuit. Further, the compensation circuit includes the first and second resistors respectively connected to the first and second transistors of the active load in series. To compensate the voltage difference due to the difference between the resistance of the feedback resistor and the resistance of the reference resistor (satisfy the later-described Formula (57)), it is necessary to adjust the collector currents in the first transistor and in the first load transistor and the collector currents in the second transistor and in the second load transistor (satisfy the later-described Formula (58)). Since the collector currents respectively flow in the first and second resistors, appropriate setting of the resistances of the first and second resistors (satisfy the later-described Formula (60)) compensates the voltage difference, thereby preventing an offset voltage. Consequently, noise reduction and improvement of offset characteristic can be ensured according to gain switching for each of the plural feedback resistors.

Moreover, in this photoreceiver/amplifier circuit, the resistances of the feedback resistor and the reference resistor are set so that the difference between a voltage between terminals of each feedback resistor and a voltage between terminals of a corresponding reference resistor becomes constant. Such usage of the common first and second resistors gives an effect of improving offset characteristics of each feedback resistor and each reference resistor. Further, it is not necessary to provide individual first and second resistors for each feedback resistor and each reference resistor, and therefore the circuit layout will not become complicated.

An optical pickup device according to the present invention includes the photoreceiver/amplifier circuit having the foregoing structure, and therefore ensures noise reduction and improved offset voltage characteristic in a photoreceiver/amplifier circuit. With this advantage, particularly when converting reflection light from an optical disk into a signal voltage, the optical pickup device improves qualities of output signals. Further, an optical disk device according to the present invention includes the optical pickup device, and therefore improves qualities of output signals in the same manner.

Additional objects, features, and strengths of the present invention will be made clear by the description below. Further, the advantages of the present invention will be evident from the following explanation in reference to the drawings.

DESCRIPTION OF THE EMBODIMENTS

First Embodiment

One embodiment of the present invention is described below with reference to FIGS. 1 to 3.

Figure 1:
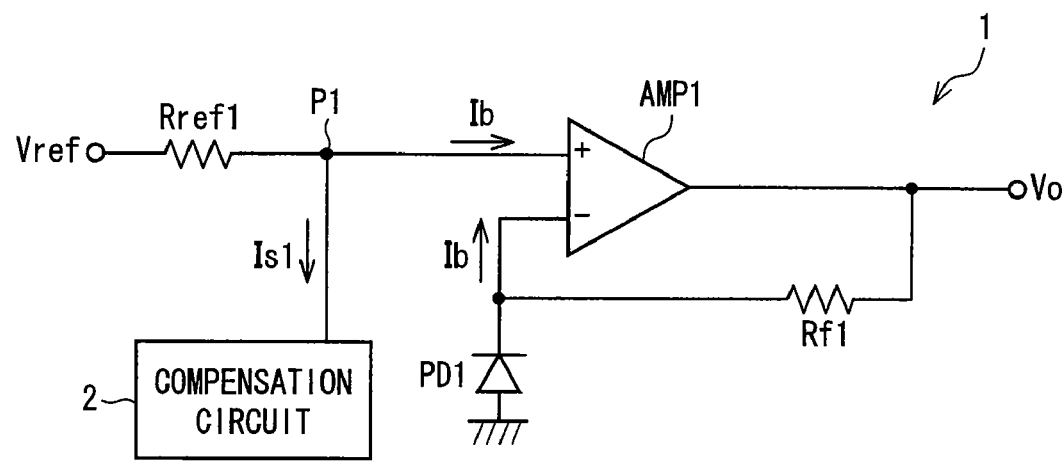
FIG. 1 is a circuit diagram showing a schematic structure of a photoreceiver/amplifier circuit according to First Embodiment of the present invention.

FIG. 1 shows a schematic structure of a photoreceiver/amplifier circuit 1 according to the present embodiment. FIG. 2 shows a circuit structure of the photoreceiver/amplifier circuit 1.

Figure 3:
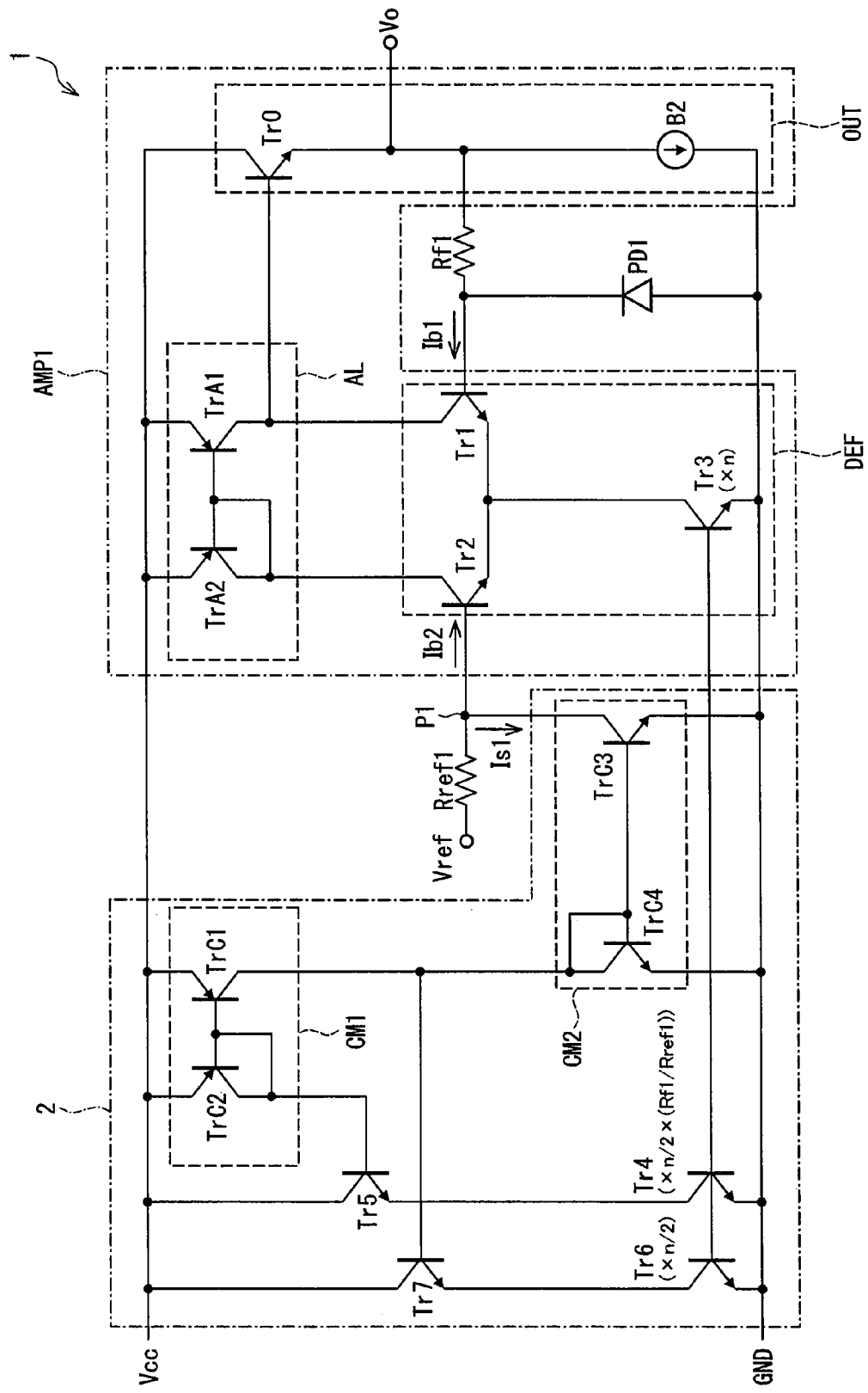
FIG. 3 is a circuit diagram showing a more detailed structure of the photoreceiver/amplifier circuit of FIG. 2.

FIG. 3 shows a detailed circuit structure of the photoreceiver/amplifier circuit 1.

Figure 16:
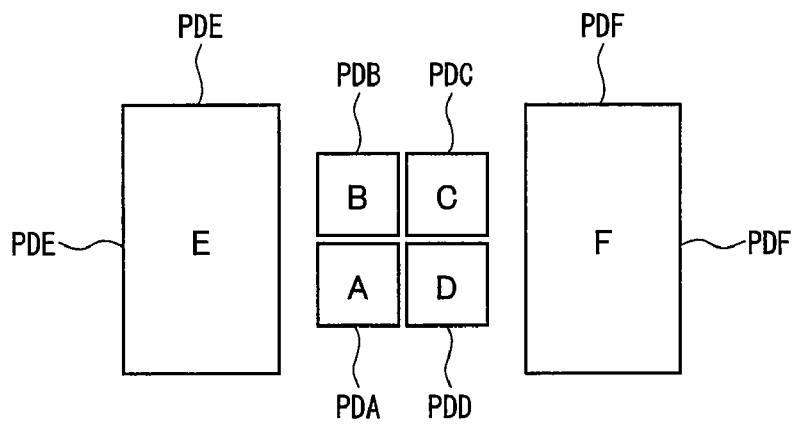
FIG. 16 is a plan view showing a structure of 1-beam-type photoreceiver photodiodes connected to the foregoing photoreceiver/amplifier circuits or conventional photoreceiver/amplifier circuits.
Figure 17:
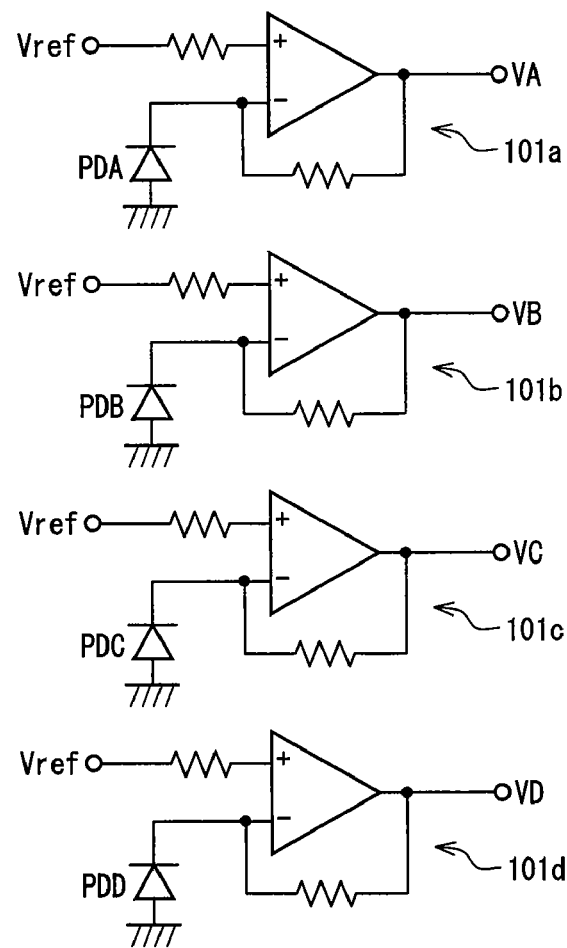
FIG. 17 is a circuit diagram showing a structure of the photoreceiver/amplifier circuits connected to the photodiodes of FIG. 16.
Figure 18:
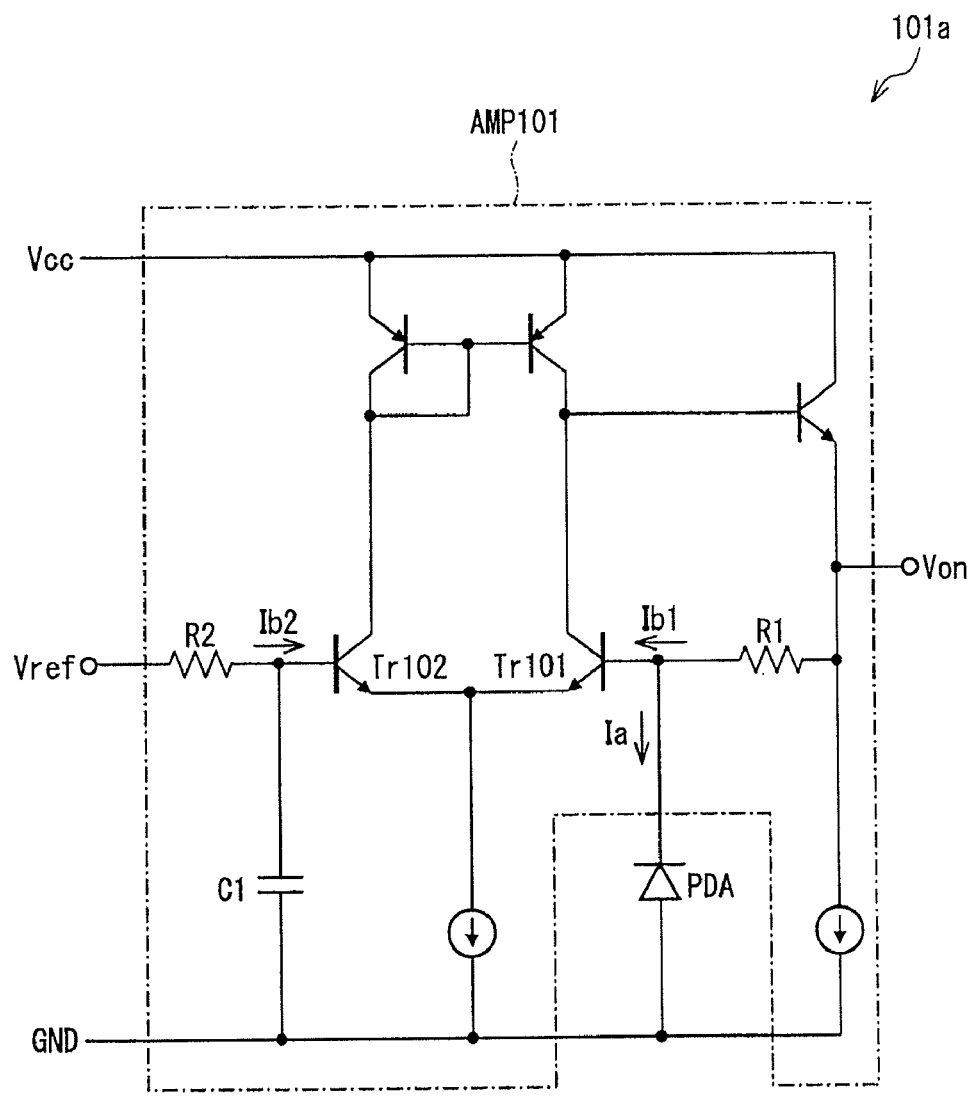
FIG. 18 is a circuit diagram showing a structure of a conventional photoreceiver/amplifier circuit compatible with a 1-beam type photodiode.

The photoreceiver/amplifier circuit 1 is used as each of the photoreceiver/amplifier circuits 101a to 101d shown in FIG. 17, and amplifies photocurrents generated in the photodiodes PDA to PDD of FIG. 16 by converting them into voltages. Note that, the photoreceiver/amplifier circuit according to the later described Second Embodiment is also used as each of the photoreceiver/amplifier circuits 101a to 101d.

As shown in FIG. 1, the photoreceiver/amplifier circuit 1 includes a photodiode PD1, a differential amplifier circuit AMP1, a feedback resistor Rf1, a reference resistor Rref1 and a compensation circuit 2.

In the photoreceiver/amplifier circuit 1, the differential amplifier circuit AMP1 serves to amplify a voltage resulting from conversion of photocurrent Ib in the photodiode PD1. The cathode of the photodiode PD1 is connected to an inverting input terminal of the differential amplifier circuit AMP1. The feedback resistor Rf1 is provided between an output terminal and an inverting input terminal of the differential amplifier circuit AMP1. One end of the reference resistor Rref1 is supplied with a reference voltage Vref, while the other end is connected to a non-inverting input terminal of the differential amplifier circuit AMP1.

The compensation circuit 2 supplies a compensation current Is1 (described later) from a junction P1 of the reference resistor Rref1 and the non-inverting input terminal of the differential amplifier circuit AMP1 so as to compensate the difference between a voltage between terminals of the feedback resistor Rf1 and a voltage between terminals of the reference resistor Rref1.

Figure 2:
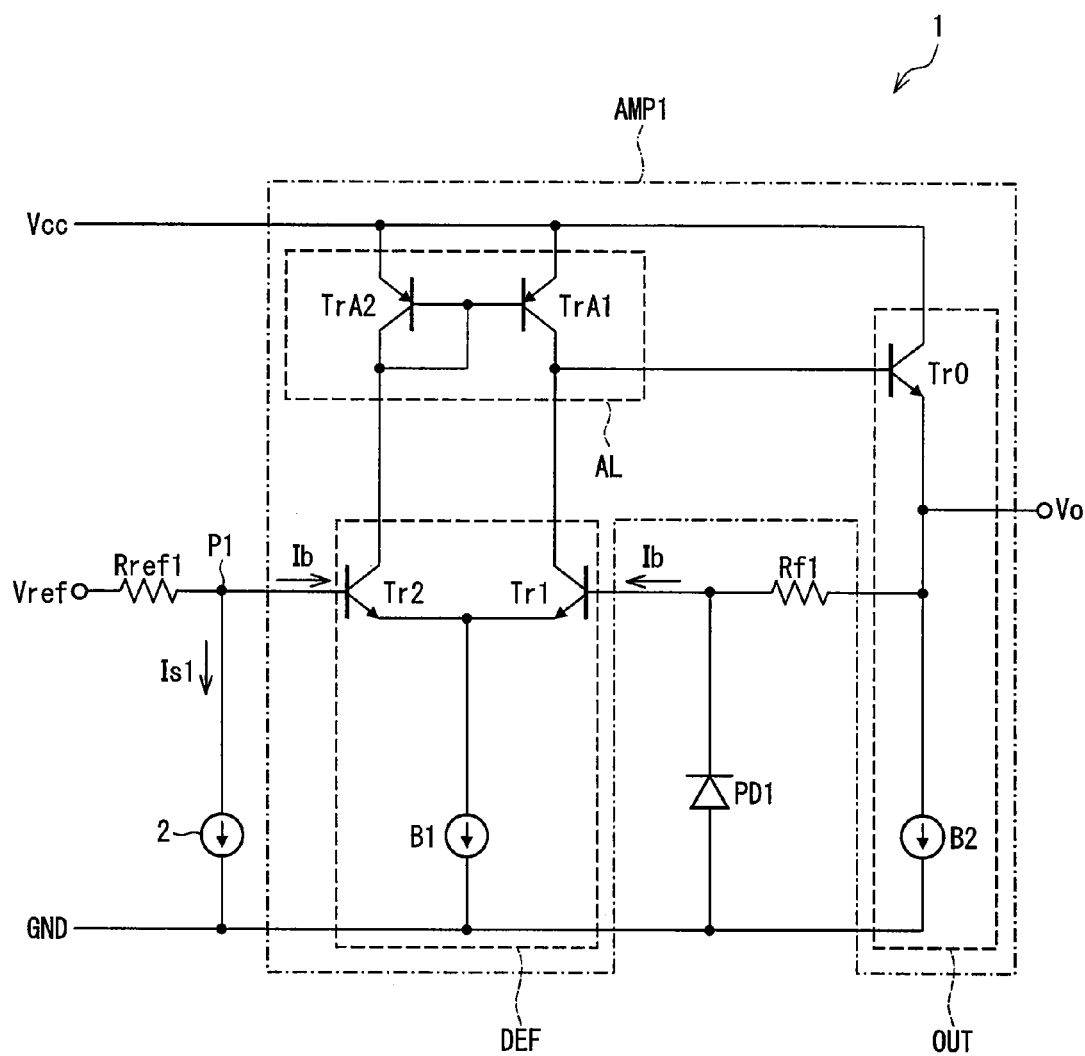
FIG. 2 is a circuit diagram showing a detailed structure of the photoreceiver/amplifier circuit of FIG. 1.

As shown in FIG. 2, the differential amplifier circuit AMP1 includes a differential circuit DEF, an active load AL, and an output circuit OUT.

The differential circuit DEF is constituted of NPN-type transistors Tr1 and Tr2, and a bias circuit B1. The transistors Tr1 and Tr2 form a differential transistor pair of the differential circuit DEF, and their emitters are both connected to one end of the bias circuit B1.

The bias circuit B1 serves as a constant current circuit for keeping a bias current constant. The bias current is a sum of the current in the transistor Tr1 and the current in the transistor Tr2.

The other end of the bias circuit B1 is connected to a ground line for supplying a ground potential GND. The bias circuit B1 is composed of a NPN-type transistor Tr3 (bias transistor), as shown in FIG. 3.

The active load AL is composed of PNP-type transistors TrA1 and TrA2. The bases of the transistor TrA1 and TrA2 are connected to each other to be further connected to a collector of the transistor TrA2. With such a structure, the transistors TrA1 and TrA2 compose a current mirror circuit. Further, the emitters of the transistors TrA1 and TrA2 are connected to a power supply line to which a power supply voltage Vcc is supplied.

Note that, the base of the transistor Tr1 serves as an inverting input terminal of the differential amplifier circuit AMP1, and the base of the transistor Tr2 serves as a non-inverting input terminal of the differential amplifier circuit AMP1.

The output circuit OUT is provided at an output stage of the photoreceiver/amplifier circuit 1, and includes a transistor TrO and a bias circuit B2 to serve as an emitter follower circuit.

The base of the NPN-type transistor TrO is connected to a collector of the transistor TrA1, and the collector is connected to the power supply line. Further, the emitter of the transistor TrO is connected to one end of the output terminal from which the output voltage Vo is outputted and to one end of the bias circuit B2. The bias circuit B2 is a constant current source, and supplies a bias current to the transistor TrO. The other end of the bias circuit B2 is connected to the ground line to which the ground potential GND is supplied.

One end of the feedback resistor Rf1 is connected to the base of the transistor Tr1 while the other end is connected to the output terminal. The cathode of the photodiode PD1 is connected to the base of the transistor Tr1 as with the feedback resistor Rf1, and the anode is connected to the power supply line. With this structure, the feedback resistor Rf1 converts a photocurrent generated in the voltage photodiode PD1 into a voltage. Further, one end of the reference resistor Rref1 is connected to the base of the transistor Tr2, while the other end is connected to the reference voltage input terminal. The reference voltage input terminal is supplied with a reference voltage Vref.

Assuming that Rf1 and Rref1 respectively express the resistances of the feedback resistor Rf1 and the reference resistor Rref1, the resistances of the feedback resistor Rf1 and the reference resistor Rref1 satisfy Rf1>Rref1 in the photoreceiver/amplifier circuit 1.

Further, the compensation current Is1 supplied by the compensation circuit 2 is denoted by the following Formula, $$Is1 = (Rf1/Rref1 - 1) \times Ib \quad (14)$$

where Ib expresses a base current in the base of the differential transistor pair (transistor Tr1 and Tr2) of the differential circuit DEF.

Next, the following more specifically explains the compensation circuit 2.

As shown in FIG. 3, the compensation circuit 2 includes current mirror circuits CM1 and CM2 and transistors Tr4 to Tr7.

The current mirror circuit CM1 is composed of NPN-type transistors TrC1 and TrC2.

On the other hand, the current mirror circuit CM2 is composed of NPN-type transistors TrC3 and TrC4.

The base of the transistors TrC1 and TrC2 are connected to each other to be further connected to the collector of the transistor TrC2. Further, the emitters of the transistors TrC1 and TrC2 are connected to a power supply line where the power supply voltage Vcc is supplied. The collector of the transistor TrC1 is connected to the collector of the transistor TrC4. The bases of the transistors TrC2 and TrC3 are connected to each other to be further connected to the collector of the transistor TrC4. The emitters of the transistor TrC3 and TrC4 are connected to the ground line.

The bases of the transistors Tr4 and Tr6 are connected to the base of the transistor Tr3, and the emitters of the transistors Tr4 and Tr6 are connected to the ground line. Further, the bases of the transistors Tr5 and Tr7 are respectively connected to the collectors of the transistors TrC2 and TrC1. The collectors of the transistors Tr5 and Tr7 are connected to the power supply line.

In the photoreceiver/amplifier circuit 1 having the foregoing structure, a photocurrent Ib1 is generated in the photodiode PD1 in response to signal light emission. The photocurrent Ib1 is converted to a voltage by a feedback resistor Rf1, and appears in an output terminal as an output voltage with respect to signal beam emission.

Here, because of the relationship=Rf1>Rref1, there is a difference between the voltage between terminals of the feedback resistor Rf1 and the voltage between terminals of the reference resistor Rref1. The difference appears in an output voltage as an offset voltage.

Therefore, in the photoreceiver/amplifier circuit 1, as described, the compensation circuit 2 supplies the compensation current Is1 from the junction P1 to suppress the offset voltage. The following explains the effect of suppressing the offset voltage by the compensation circuit 12.

Note that, in the later-described processing, the voltages between base-emitter of the transistors Tr1 and Tr2 serving as a differential transistor pair are assumed to be equal.

In the compensation circuit 2, the current in the transistor Tr4 is Rf1/Rref1/2 times the bias current in the transistor Tr3 serving as a bias transistor. Further, the current in the transistor Tr7 is ½ times the bias current of the transistor Tr3. The compensation current Is1 flows in the transistor TrC3 of the current mirror circuit CM2.

Assuming that the collector currents and the base currents of the transistors Tr3 to Tr7 are respectively expressed as Ic3 to Ic7 and Ib3 to Ib7, and hfe expresses a common transistor hfe for all of the transistors Tr3 to Tr7, the relationship between the collector currents Ic3 to Ic7 and the base currents Ib3 to Ib7 is denoted by Formula (15) through Formula (19).

$$Ic5 = Ic4 = (Ic3/2) \times (Rf1/Rref1) \quad (15)$$

-continued $$Ib5 = Ic5/hfe = (Ic3/2) \times (Rf1/Rref1)/hfe \quad (16)$$

$$Ic6 = Ic7 = Ic3/2 \quad (17)$$

$$Ib7 = Ic7/hfe = Ic3/2/hfe \quad (18)$$

$$\begin{aligned} Is1 &= Ib5 - Ib7 \\ &= (Ic3/2) \times (Rf1/Rref1)/hfe - Ic3/2/hfe \\ &= Ic3/2/hfe \times (Rf1/Rref1 - 1) \end{aligned} \quad (19)$$

Where the base currents of the transistors Tr1 and Tr2 are expressed respectively as Ib1 and Ib2 which are equal, they are denoted by the following formula.

$$Ib1 \approx Ib2 = Ic3/2/hfe \quad (20)$$

Therefore, the voltage VRf1 generated between the terminals of the feedback resistor Rf1 is denoted by the following formula.

$$VRf1 = Rf1 \times Ib1 = Rf1 \times Ic3/2/hfe \quad (21)$$

Further, the voltage VRref1 generated between the terminals of the reference resistor Rref1 is denoted by the following formula, if a compensation circuit 2 is not provided.

$$VRref1 = Rref1 \times Ib2 = Rref1 \times Ic3/2/hfe \quad (22)$$

Therefore, the voltage difference Vdef1 generated in the resistor pair of the feedback resistor Rf1 and the reference resistor Rref1 is denoted by the following formula.

$$\begin{aligned} Vdef1 &= VRf1 - VRref1 \\ &= Rf1 \times Ic3/2/hfe - Rref1 \times Ic3/2/hfe \\ &= Ic3/2/hfe \times (Rf1 - Rref1) \end{aligned} \quad (23)$$

Therefore, the voltage difference Vdef1(=VRf1−VRref1) becomes an offset voltage.

Therefore, by providing the compensation circuit 2, the offset voltage can be nulled by the following manner.

First, the voltage VRf1 is denoted by the following formula.

$$\begin{aligned} VRref1 &= Rref1 \times (Ib2 + Is1) \\ &= Rref1 \times \left( \frac{Ic3/2/hfe + Ic3/2/hfe \times}{(Rf1/Rref1 - 1)} \right) \\ &= Rf1 \times Ic3/2/hfe \end{aligned} \quad (24)$$

Accordingly, the voltage difference Vdef1 is denoted by the following formula.

$$\begin{aligned} Vdef1 &= VRf1 - VRref1 \\ &= Rf1 \times Ic3/2/hfe - Rf1 \times Ic3/2/hfe \\ &= 0 \end{aligned} \quad (25)$$

The compensation circuit 2 thus increases the current in the reference resistor Rref1 by the amount of the compensation current Is1. As a result, the difference between the voltage between terminals of the feedback resistor Rf1 and the voltage between terminals of the reference resistor Rref1 is cancelled, and the offset voltage is nulled.

As described, since the resistance of the feedback resistor Rf1 and the resistance of the reference resistor Rref1 satisfy the relationship: Rf1>Rref1, the noise can be reduced. Moreover, with the provision of the compensation circuit 2, the photoreceiver/amplifier circuit 1 ensures a desirable offset characteristic.

Second Embodiment

Another embodiment of the present invention is described below with reference to FIGS. 4 through 6. For ease of explanation, materials having the equivalent functions as those shown in the drawings pertaining to the foregoing First Embodiment will be given the same reference symbols, and explanation thereof will be omitted here.

Figure 4:
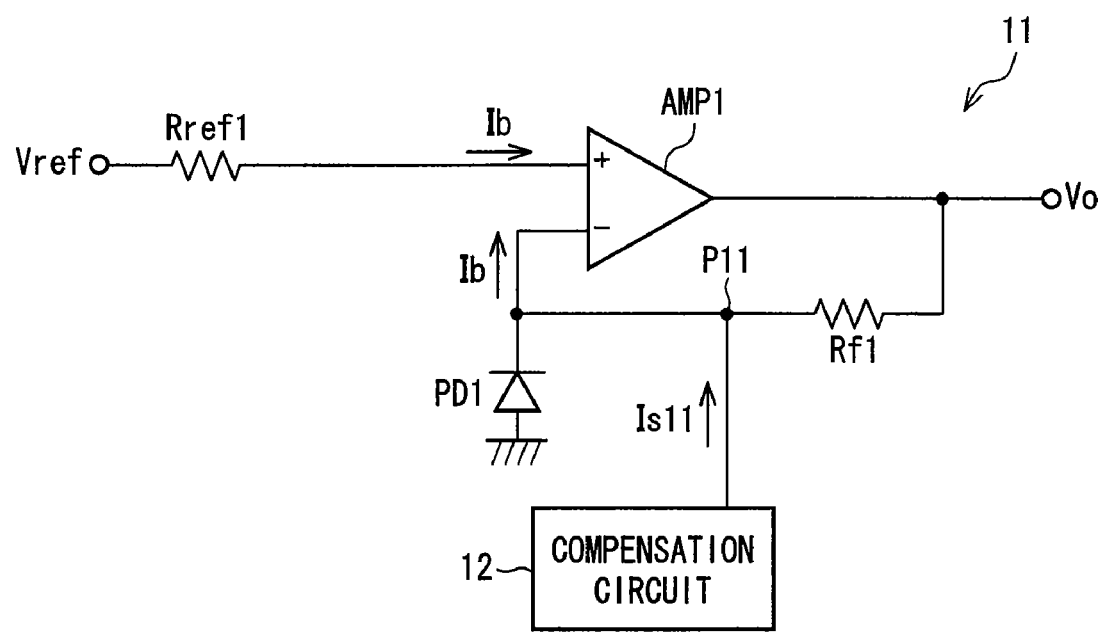
FIG. 4 is a circuit diagram showing a schematic structure of a photoreceiver/amplifier circuit according to Second Embodiment of the present invention.

FIG. 4 shows a schematic structure of a photoreceiver/amplifier circuit 11 according to the present embodiment. FIG. 5 shows a circuit structure of the photoreceiver/amplifier circuit 11. FIG. 6 shows a detailed circuit structure of the photoreceiver/amplifier circuit 11.

Figure 5:
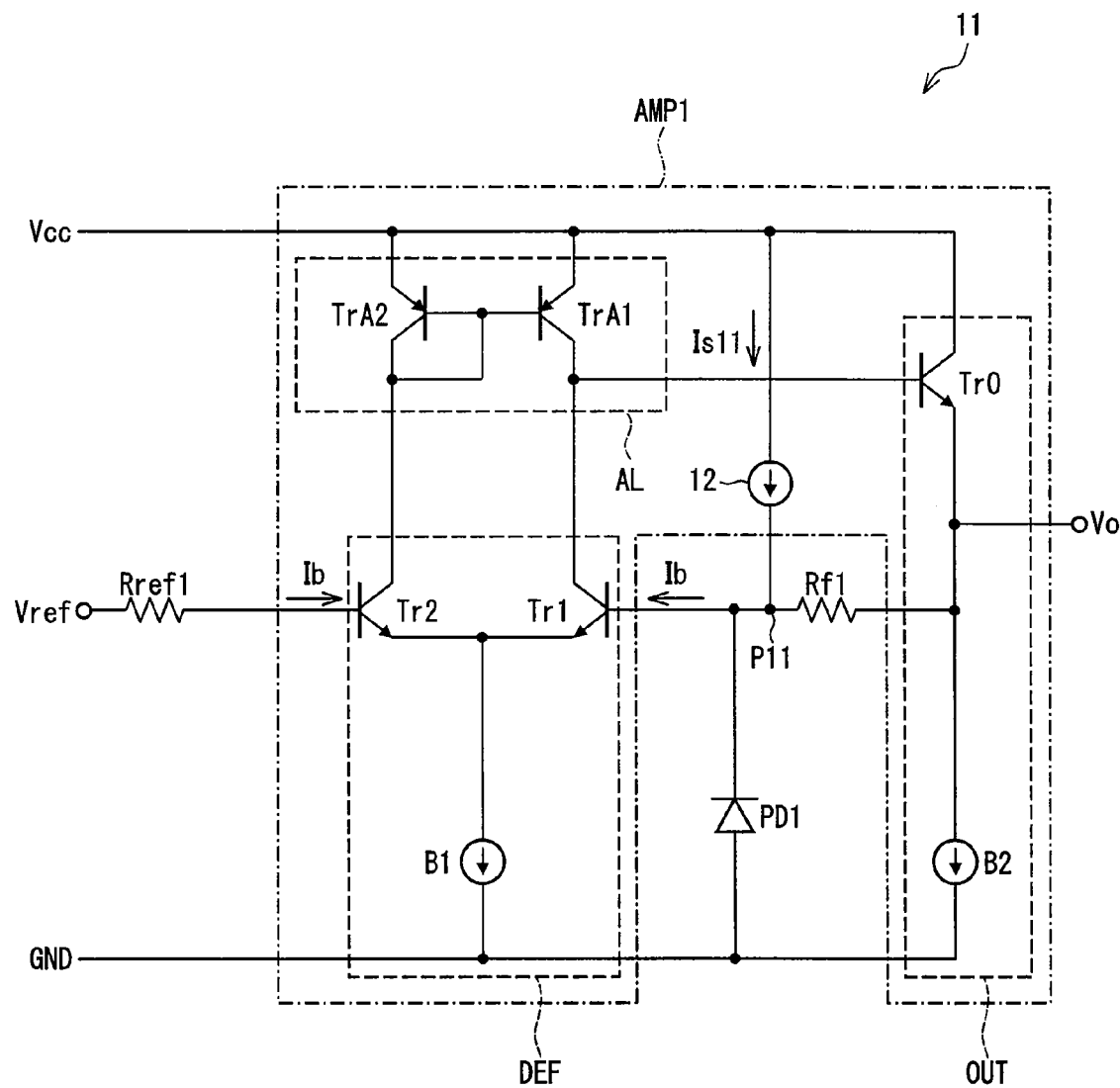
FIG. 5 is a circuit diagram showing a detailed structure of the photoreceiver/amplifier circuit of FIG. 4.

As shown in FIG. 5, the photoreceiver/amplifier circuit 11 includes a photodiode PD1, a differential amplifier circuit AMP1, a feedback resistor Rf1, and a reference resistor Rref1, as with the photoreceiver/amplifier circuit 1. However, the photoreceiver/amplifier circuit 11 includes a compensation circuit 12 instead of the compensation circuit 2.

Unlike the compensation circuit 2, the compensation circuit 12 supplies a compensation current Is11 (described later) into a junction P11 between the feedback resistor Rf1 and the inverting input terminal of the differential amplifier circuit AMP1, so as to compensate the difference between a voltage between terminals of the feedback resistor Rf1 and a voltage between terminals of the reference resistor Rref1. The compensation current Is11 is denoted by the following formula.

$$Is11 = (1 - Rref1/Rf1) \times Ib \quad (26)$$

Next, the following more specifically explains the compensation circuit 12.

Figure 6:
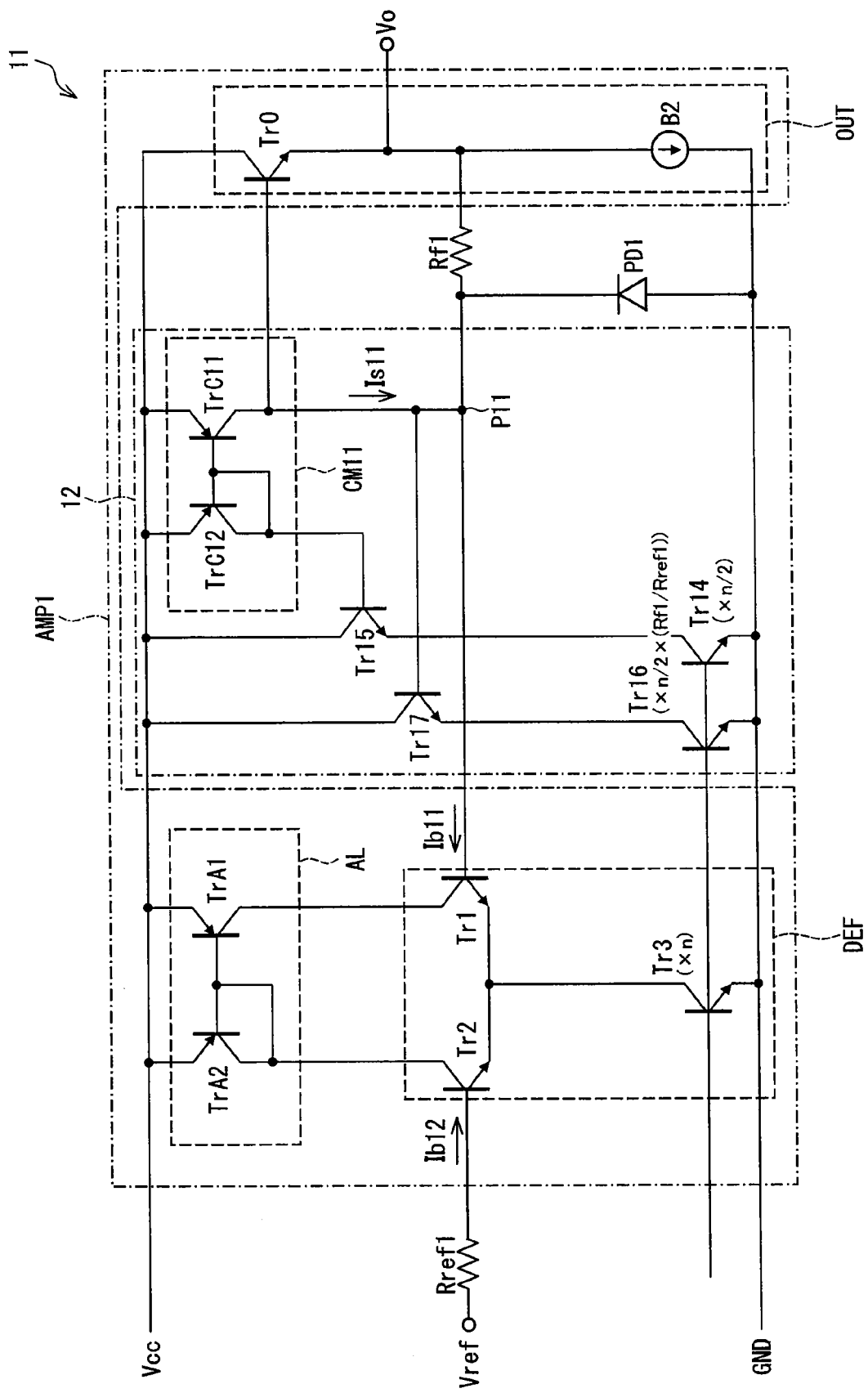
FIG. 6 is a circuit diagram showing a more detailed structure of the photoreceiver/amplifier circuit of FIG. 4.

As shown in FIG. 6, the compensation circuit 12 has the current mirror circuits CM11 and transistors Tr14 to Tr17.

The current mirror circuit CM11 is constituted of PNP-type transistors TrC11 and TrC12.

The bases of the transistors TrC11 and TrC12 are connected to each other to be further connected to the collector of the transistor TrC12. The emitters of the transistors TrC11 and TrC12 are connected to the power supply line. The collector of the transistor TrC11 is connected to the base of the transistor Tr1.

The bases of the transistors Tr14 and Tr16 are connected to the base of the transistor Tr3, and the emitters of the transistors Tr14 and Tr16 are connected to the ground line. Further, the bases of the transistors Tr15 and Tr17 are respectively connected to the collectors of the transistors TrC12 and TrC11. The collectors of the transistors Tr15 and Tr17 are connected to the power supply line.

In the photoreceiver/amplifier circuit 11 having the foregoing structure, the compensation circuit 12 supplies a compensation current Is11 into the junction P11, so as to suppress the offset voltage. The following explains this effect of suppressing the offset voltage.

Note that, in the later-described processing, the voltages between base-emitter of the transistors Tr1 and Tr2 serving as a differential transistor pair are assumed to be equal.

In the compensation circuit 12, the current in the transistor Tr14 is ½ times the bias current of the transistor Tr13. Meanwhile, the transistor Tr17 supplies to the output of the current mirror circuit CM11 a current which is Rref1/Rf1/2 times the bias current in the transistor Tr13. The compensation circuit 12 also supplies the compensation current Is11 to the photoreceiver/amplifier circuit 11.

Assuming that the collector currents and the base currents of the transistors Tr13 to Tr17 are respectively expressed as Ic13 to Ic17 and Ib13 to Ib17, and hfe expresses a common transistor hfe for all of the transistors Tr13 to Tr17, the relationship between the collector currents Ic13 to Ic17 and the base currents Ib13 to Ib17 is denoted by Formula (27) through Formula (31).

$$Ic14 = Ic15 = Ic13/2 \quad (27)$$

$$Ib15 = Ic15/hfe = Ic13/2 \quad (28)$$

$$Ic16 = Ic17 = Ic13/2 \times Rref1/Rf1 \quad (29)$$

$$Ib17 = Ic17/hfe = Ic13/2 \times Rref1/Rf1/hfe \quad (30)$$

$$\begin{aligned} Is11 &= Ib15 - Ib17 \\ &= Ic13/2/hfe - Ic13/2 \times Rref1/Rf1/hfe \\ &= Ic13/2/hfe \times (1 - Rref1/Rf1) \end{aligned} \quad (31)$$

where the base currents of the transistors Tr1 and Tr2 are expressed respectively as Ib11 and Ib12 which are equal, they are denoted by the following formula.

$$Ib11 \approx Ib12 = Ic13/2/hfe \quad (32)$$

Therefore, the voltage VRref1 generated between the terminals of the reference resistor Rref1 is denoted by the following formula.

$$VRref1 = Rref1 \times Ib12 = Rref1 \times Ic13/2/hfe \quad (33)$$

Therefore, the voltage VRf1 generated between the terminals of the feedback resistor Rf1 is denoted by the following formula, if the compensation circuit 12 is not provided.

$$VRf11 = Rf1 \times Ib1 = Rf1 \times Ic13/2/hfe \quad (34)$$

Therefore, the voltage difference Vdef11 generated in the resistor pair of the feedback resistor Rf1 and the reference resistor Rref1 is denoted by the following formula.

$$\begin{aligned} Vdef11 &= VRf11 - VRref11 \\ &= Rf1 \times Ic13/2/hfe - Rref1 \times Ic13/2/hfe \\ &= Ic13/2/hfe \times (Rf1 - Rref1) \end{aligned} \quad (35)$$

Therefore, the voltage difference Vdef11(=VRf11−VRref11) becomes an offset voltage.

Therefore, by providing the compensation circuit 12, the offset voltage can be nulled by the following manner.

First, the voltage VRf11 is denoted by the following formula.

$$\begin{aligned} VRf11 &= Rf1 \times (Ib11 - Is11) \\ &= Rf1 \times \left( \frac{Ic13/2/hfe - Ic13/2/hfe \times}{(1 - Rref1/Rf1)} \right) \\ &= Rref1 \times Ic13/2/hfe \end{aligned} \quad (36)$$

Accordingly, the voltage difference Vdef11 is denoted by the following formula.

$$\begin{aligned} Vdef11 &= VRf11 - VRref11 \\ &= Rref1 \times Ic13/2/hfe - Rref1 \times Ic13/2/hfe \\ &= 0 \end{aligned} \quad (37)$$

The compensation circuit 12 thus increases the current in the reference resistor Rref1 by the amount of the compensation current Is11. As a result, the difference between the voltage between terminals of the feedback resistor Rf1 and the voltage between terminals of the reference resistor Rref1 is cancelled, and the offset voltage is nulled.

As described, in the photoreceiver/amplifier circuit 11, since the resistance of the feedback resistor Rf1 and the resistance of the reference resistor Rref1 satisfy the relationship: Rf1>Rref1, the noise can be reduced. Moreover, with the provision of the compensation circuit 12, the photoreceiver/amplifier circuit 11 ensures a desirable offset characteristic.

Third Embodiment

Still another embodiment of the present invention is described below with reference to FIGS. 7 and 8. For ease of explanation, materials having the equivalent functions as those shown in the drawings pertaining to the foregoing First Embodiment will be given the same reference symbols, and explanation thereof will be omitted here.

Figure 7:
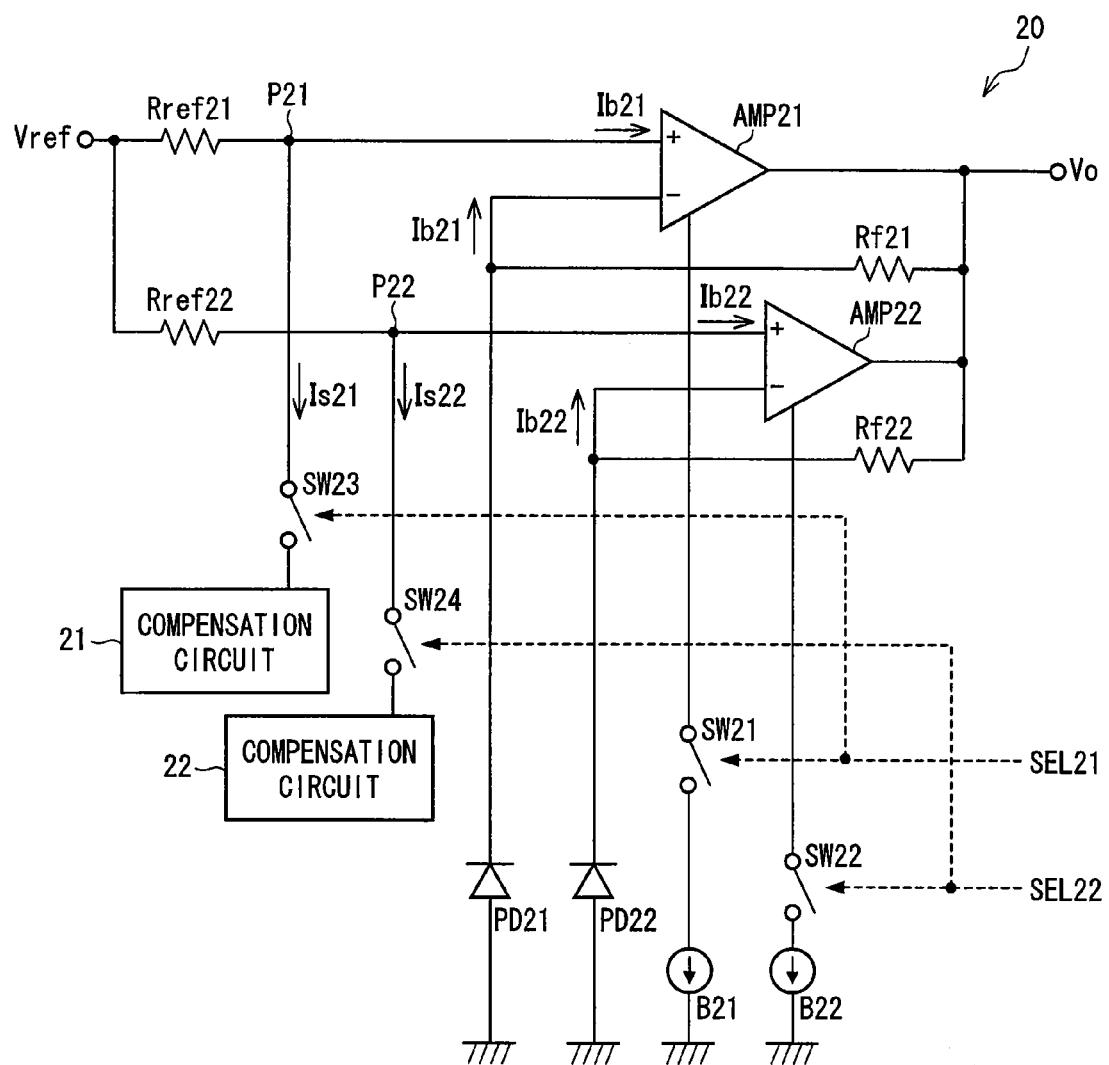
FIG. 7 is a circuit diagram showing a schematic structure of a photoreceiver/amplifier circuit according to Third Embodiment of the present invention.

FIG. 7 shows a circuit structure of a photoreceiver/amplifier circuit 20 according to the present embodiment. FIG. 8 shows a detailed circuit structure of the photoreceiver/amplifier circuit 20.

Figure 19:
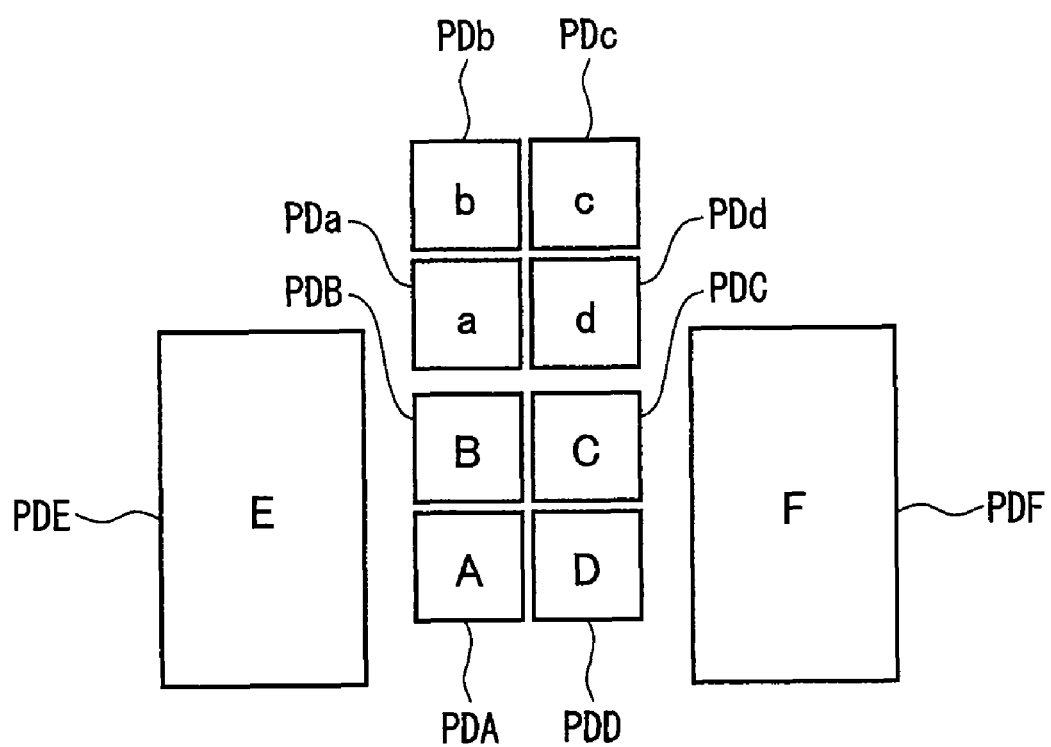
FIG. 19 is a plan view showing a structure of a 2-beam-type photoreceiver photodiodes connected to the foregoing photoreceiver/amplifier circuits or conventional photoreceiver/amplifier circuits.
Figure 20:
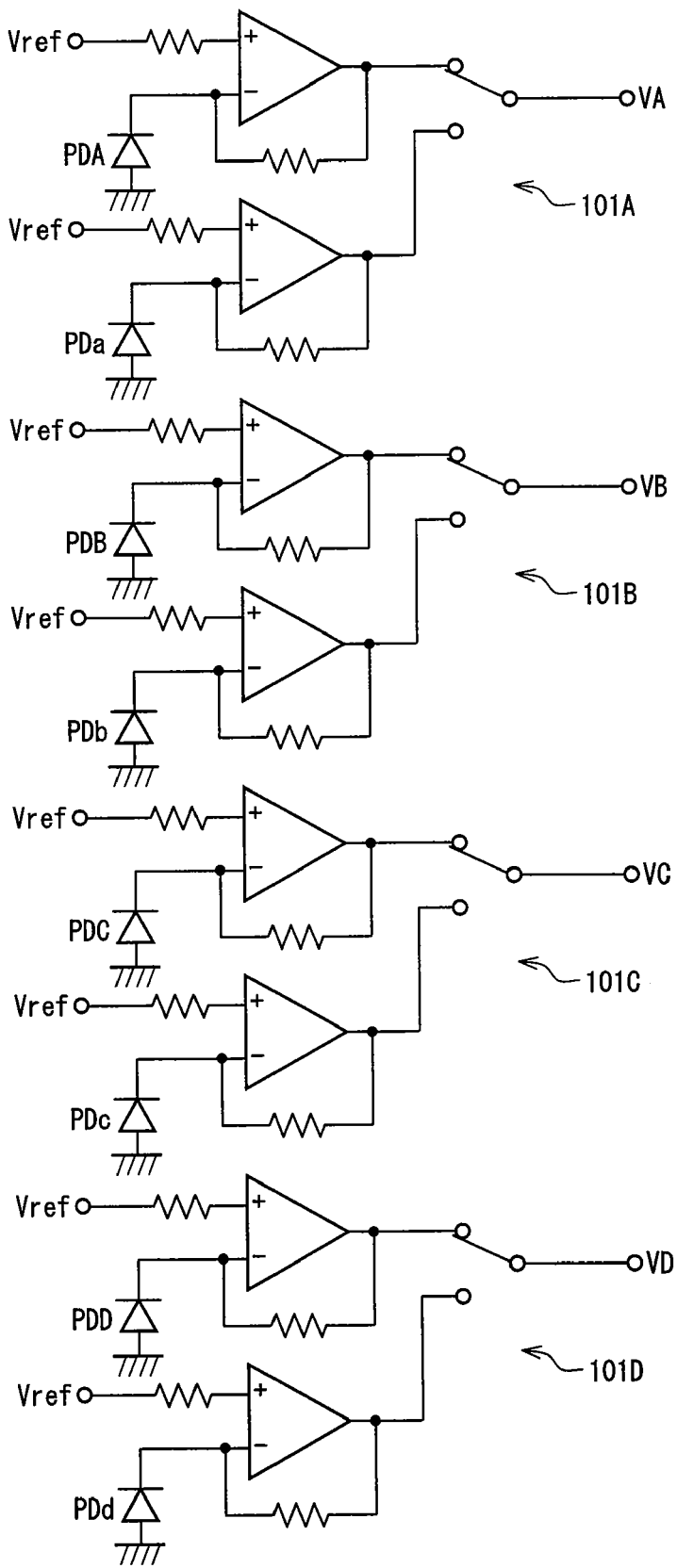
FIG. 20 is a circuit diagram showing a structure of the photoreceiver/amplifier circuits connected to the photodiodes of FIG. 19.
Figure 21:
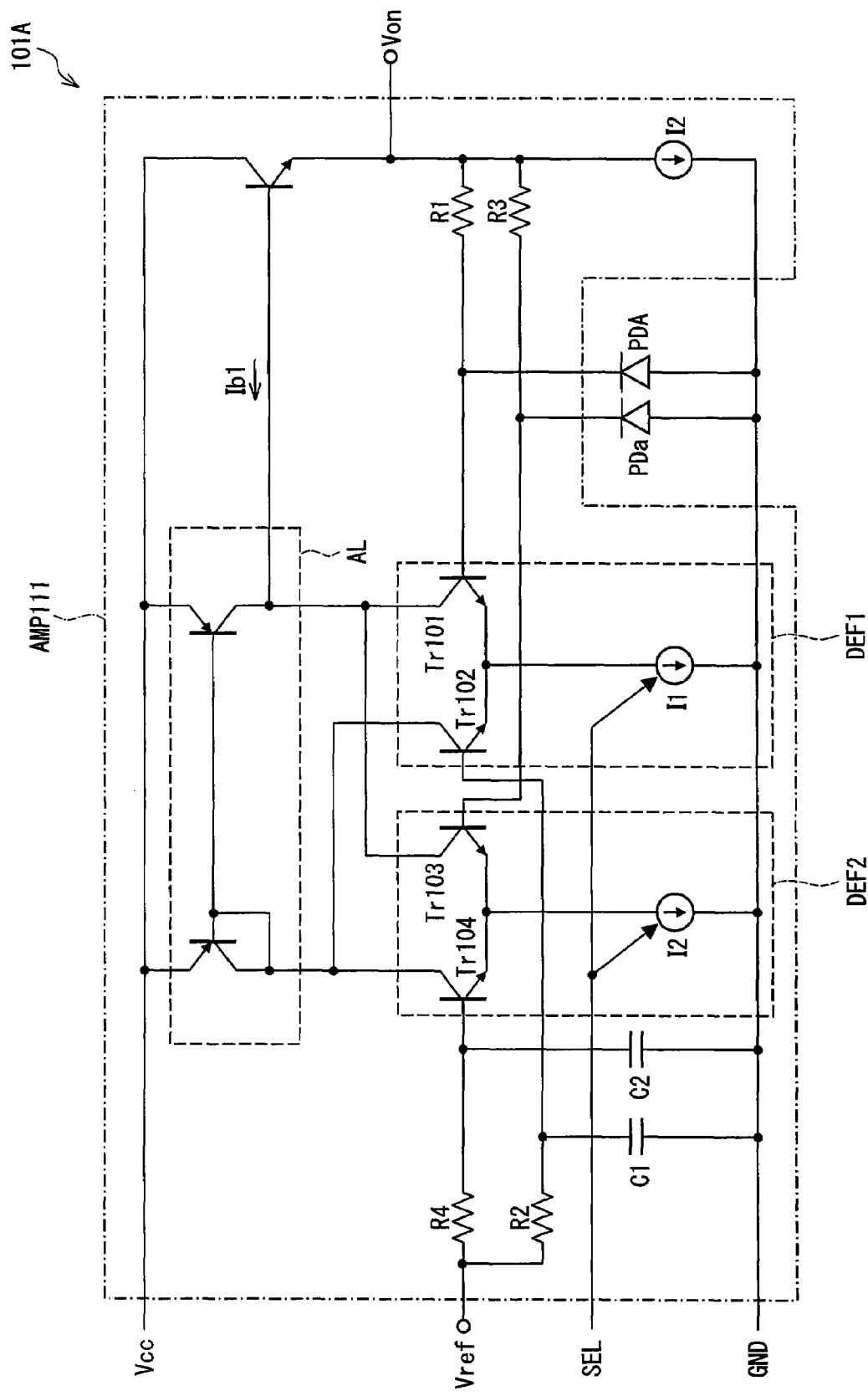
FIG. 21 is a circuit diagram showing a structure of a conventional photoreceiver/amplifier circuit compatible with a 2-beam-type photoreceiver photodiode.

The photoreceiver/amplifier circuit 20 is used as each of the photoreceiver/amplifier circuits 101A to 101D shown in FIG. 20, and amplifies photocurrents generated in the photodiodes PDA to PDD and PDa to PDd of FIG. 19 by converting them into voltages. Note that, the photoreceiver/amplifier circuits according to the later described Fourth and Ninth Embodiments are also used as each of the photoreceiver/amplifier circuits 101A to 101D.

As shown in FIG. 7, the photoreceiver/amplifier circuit 20 includes photodiodes PD21 and PD22, differential amplifier circuits AMP21 and AMP22, feedback resistors Rf21 and Rf22, reference resistors Rref21 and Rref22, and compensation circuits 21 and 22.

In the photoreceiver/amplifier circuit 20, the differential amplifier circuit AMP21 serves to amplify a voltage resulting from conversion of photocurrent Ib21 in the photodiode PD21. The cathode of the photodiode PD21 is connected to an inverting input terminal of the differential amplifier circuit AMP21. The feedback resistor Rf21 is provided between an output terminal and an inverting input terminal of the differential amplifier circuit AMP21. One end of the reference resistor Rref21 is supplied with a reference voltage Vref, while the other end is connected to a non-inverting input terminal of the differential amplifier circuit AMP21.

In the photoreceiver/amplifier circuit 20, the differential amplifier circuit AMP22 serves to amplify a voltage resulting from conversion of photocurrent Ib22 in the photodiode PD22. The cathode of the photodiode PD22 is connected to an inverting input terminal of the differential amplifier circuit AMP22. The feedback resistor Rf22 is provided between an output terminal and an inverting input terminal of the differential amplifier circuit AMP22. One end of the reference resistor Rref22 is supplied with a reference voltage Vref, while the other end is connected to a non-inverting input terminal of the differential amplifier circuit AMP22.

Figure 8:
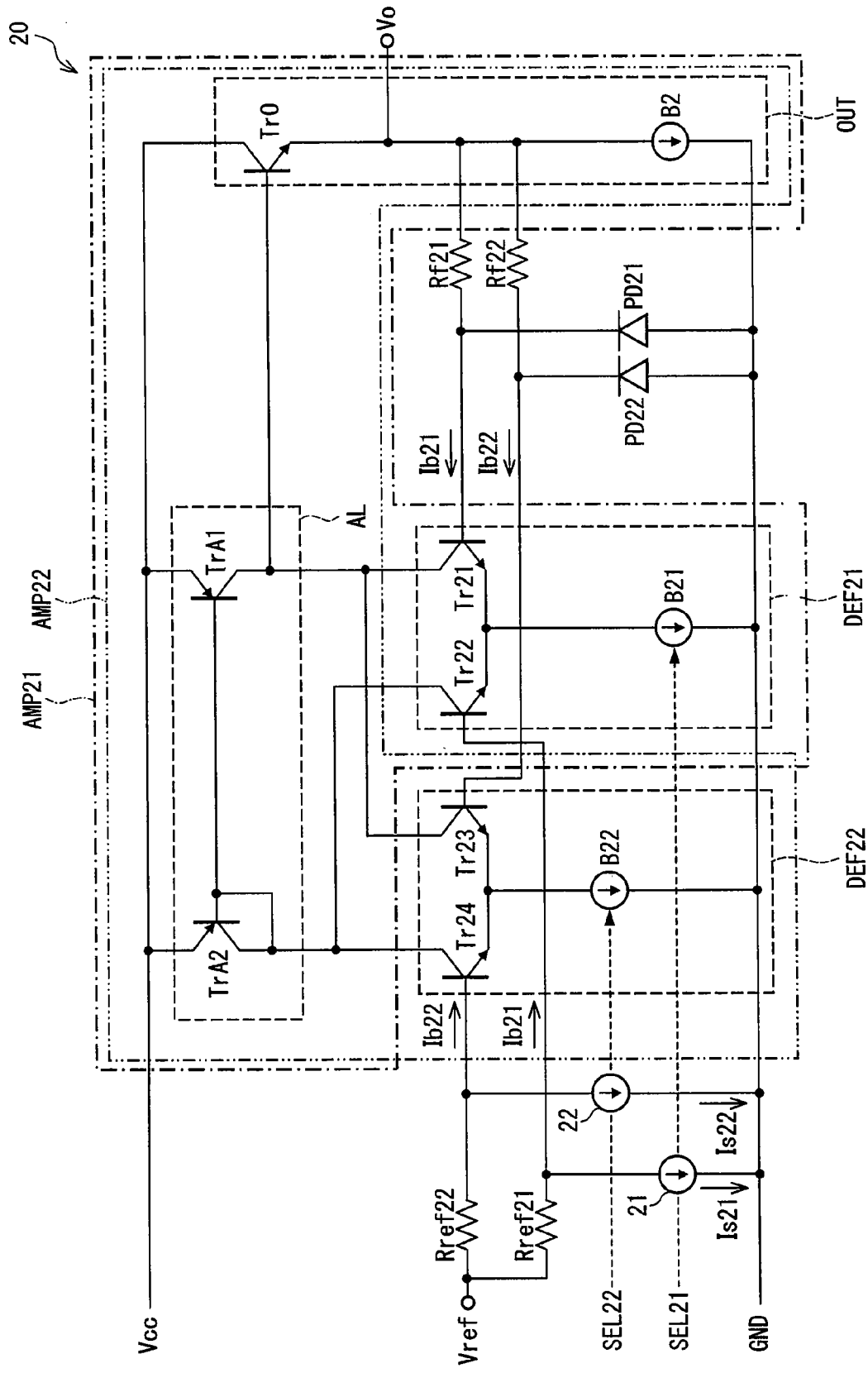
FIG. 8 is a circuit diagram showing a detailed structure of the photoreceiver/amplifier circuit of FIG. 7.

As shown in FIG. 8, the differential amplifier circuit AMP21 includes a differential circuit DEF21, an active load AL and an output circuit OUT; and the differential amplifier circuit AMP22 includes a differential circuit DEF22, an active load AL, and an output circuit OUT. That is, the active load AL and the output circuit OUT are common components for the differential amplifier circuits AMP21 and AMP22.

The differential circuit DEF21 is constituted of NPN-type transistors Tr21 and Tr22, and a bias circuit B21. The transistors Tr21 and Tr22 form a differential transistor pair of the differential circuit DEF21, and their emitters are both connected to one end of the bias circuit B21. The bias circuit B21 serves as a constant current circuit for keeping a bias current constant. The bias current is a sum of the current in the transistor Tr21 and the current in the transistor Tr22. The other end of the bias circuit B21 is connected to a ground line. The bias circuit B21 is composed of a NPN-type transistor (bias transistor), which is not shown in the figure.

The differential circuit DEF22 is constituted of NPN-type transistors Tr23 and Tr24, and a bias circuit B22. The transistors Tr23 and Tr24 form a differential transistor pair of the differential circuit DEF22, and their emitters are both connected to one end of the bias circuit B22. The bias circuit B22 serves as a constant current circuit for keeping a bias current constant. The bias current is a sum of the current in the transistor Tr23 and the current in the transistor Tr24. The other end of the bias circuit B22 is connected to a ground line. The bias circuit B22 is composed of a NPN-type transistor (bias transistor), which is not shown in the figure.

Further, the differential amplifier circuit AMP21 is brought into operation in response to current supply by the bias circuit B21. Meanwhile, the differential amplifier circuit AMP22 is brought into operation in response to current supply by the bias circuit B22. The bias circuits B21 and B22 are controlled by the selecting signals SEL21 and SEL22, so that only one of them is brought into operation. Therefore, the differential amplifier circuits AMP21 and AMP22 include switches SW21 and SW22, respectively.

The switches SW21 and SW22 are ON/OFF switches for switching between On and Off of current supply from the bias circuits B21 and B22, respectively. The switches SW21 and SW22 turns on or off by the selecting signals SEL21 and SEL22, respectively. More specifically, the switches SW21 and SW22 are controlled so that one of them is always turned off when the other is turned on.

With this structure, when one of the bias circuits B21 and B22 is caused to supply currents, the other is suspended not to carry out current supply. Accordingly, by bringing one of the differential amplifier circuits AMP21 and AMP22 into operation, the photoreception signal of the corresponding one of the photodiodes PD21 and PD22 is selectively subjected to I-V conversion, and the result is outputted.

The compensation circuit 21 supplies a compensation current Is21 (described later) from a junction P21 of the reference resistor Rref21 and the non-inverting input terminal of the differential amplifier circuit AMP21 so as to compensate the difference between a voltage between terminals of the feedback resistor Rf21 and a voltage between terminals of the reference resistor Rref21. Meanwhile, the compensation circuit 22 supplies a compensation current Is22 (described later) from a junction P22 of the reference resistor Rref22 and the non-inverting input terminal of the differential amplifier circuit AMP22 so as to compensate the difference between a voltage between terminals of the feedback resistor Rf22 and a voltage between terminals of the reference resistor Rref22.

Further, the switches SW23 and SW24 are provided between the compensation circuits 21 and 22, and the junctions P21 and P22, respectively. The switch SW23 is a ON/OFF switch controlled by the control signal SLE21, and is turned on or off in synchronism with the switch SW21. The switch SW24 is a ON/OFF switch controlled by the control signal SLE22, and is turned on or off in synchronism with the switch SW22.

Assuming that Rf21 and Rref21 respectively express the resistances of the feedback resistor Rf21 and the reference resistor Rref21, the resistances of the feedback resistor Rf21 and the reference resistor Rref21 satisfy Rf21>Rref21 in the photoreceiver/amplifier circuit 20. Similarly, assuming that Rf22 and Rref22 respectively express the resistances of the feedback resistor Rf22 and the reference resistor Rref22, the resistances of the feedback resistor Rf22 and the reference resistor Rref22 satisfy Rf22>Rref22 in the photoreceiver/amplifier circuit 20.

Further, the compensation currents Is21 and Is22 supplied by the compensation circuits 21 and 22 are denoted by the following Formulas (38) and (39).

$$Is21 = (Rf21/Rref21 - 1) \times Ib21 \quad (38)$$

$$Is22 = (Rf22/Rref22 - 1) \times Ib22 \quad (39)$$

where Ib21 expresses a base current in the base of the differential transistor pair (transistors Tr21 and Tr22) of the differential circuit DEF21, and Ib22 expresses a base current which flows in the base of the differential transistor pair (transistors Tr23 and Tr24) of the differential circuit DEF22.

The compensation circuits 21 and 22 are substantially identical in structure to the compensation circuit 2 shown in FIG. 3, except for the supply of compensation currents Is21 and Is22. The detailed explanation of the compensation circuits 21 and 22 is therefore omitted here.

In the photoreceiver/amplifier circuit 20 having the foregoing structure, to reproduce a CD for example, the switches SW21 and SW23 are turned on. As a result, the differential amplifier circuit AMP21 is brought into operation, and the compensation circuit 21 supplies the compensation current Is 21 from the junction P21. At this time, by turning off the switches SW22 and SW24, the operation of the differential amplifier circuit AMP22 is stopped, and the supply of the compensation current Is 22 from the junction P22 by the compensation circuit 22 is suspended.

In the meantime, to reproduce a DVD for example, the switches SW22 and SW24 are turned on. As a result, the differential amplifier circuit AMP22 is brought into operation, and the compensation circuit 22 supplies the compensation current Is 22 from the junction P22. At this time, by turning off the switches SW21 and SW23, the operation of the differential amplifier circuit AMP21 is stopped, and the supply of the compensation current Is 21 from the junction P21 by the compensation circuit 21 is suspended.

As described, in the photoreceiver/amplifier circuit 20, one of the differential amplifier circuits AMP21 and AMP22 is brought into operation, and one of the reception signals of the photodiodes PD21 and PD22 is selectively subjected to I-V conversion. Further, during operations of the differential amplifier circuits AMP21 and AMP22, the difference between the voltage between terminals of the feedback resistor Rf21 and the voltage between terminals of the reference resistor Rref21 is compensated by the compensation currents Is21 and Is22 from the compensation circuits 21 and 22. Consequently, the offset voltage is nulled. At this time, the flow rates of the compensation currents are adjusted according to their bias currents of the bias circuits B21 and B22, the gain resistors, and the reference resistor ratios (Rf21/Rref21, Rf22/Rref22).

As described, the photoreceiver/amplifier circuit 20 is arranged such that the resistances of the feedback resistors Rf21 and Rf22, and the resistances of the reference resistors Rref21 and Rref 22 satisfy: Rf21>Rref21, Rf22>Rref22. With this arrangement, the photoreceiver/amplifier circuit 20 achieves noise reduction. Moreover, with the provision of the compensation circuits 21 and 22, the photoreceiver/amplifier circuit 20 is capable of changing the noise characteristic according to the wavelength of signal light or the gain, when the feedback resistors Rf21 and Rf22 (gain resistor) are selectively operated according to the wavelength of signal light. The photoreceiver/amplifier circuit 20 also ensures desirable offset voltage characteristics according to the feedback resistors Rf21 and Rf22.

Note that, though the foregoing embodiment describes the structure including two photodiodes PD21 and PD22, three or more photodiodes may be used. This structure using three or more photodiodes ensures the same effect as above by providing the same number of compensation circuits. The same can be said for any embodiments below using two photodiodes.

Fourth Embodiment

Yet another embodiment of the present invention is described below with reference to FIGS. 9 and 10. For ease of explanation, materials having the equivalent functions as those shown in the drawings pertaining to the foregoing Third Embodiment will be given the same reference symbols, and explanation thereof will be omitted here.

Figure 9:
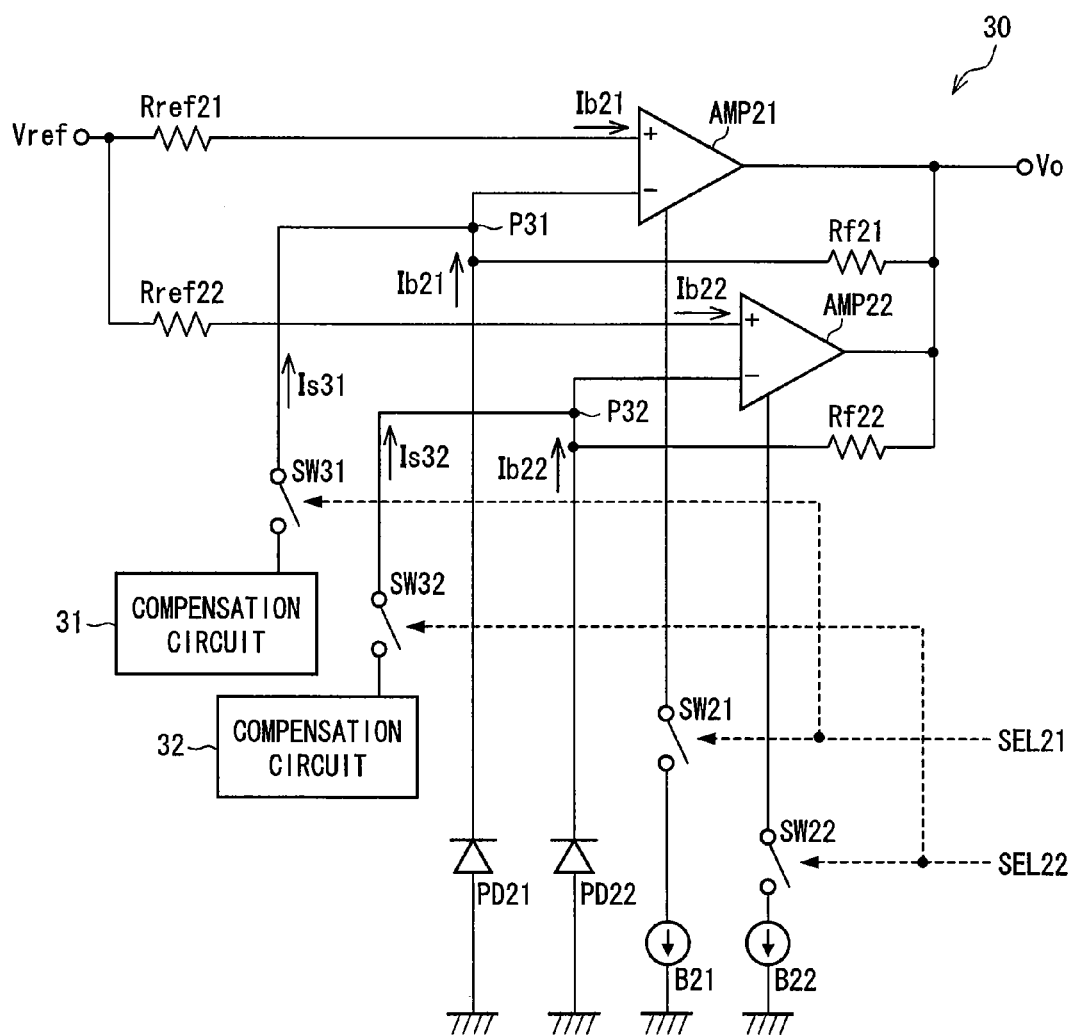
FIG. 9 is a circuit diagram showing a schematic structure of a photoreceiver/amplifier circuit according to Fourth Embodiment of the present invention.

FIG. 9 is a schematic structure showing a photoreceiver/amplifier circuit 30 according to the present embodiment. FIG. 10 shows a detailed structure of the photoreceiver/amplifier circuit 30.

Figure 10:
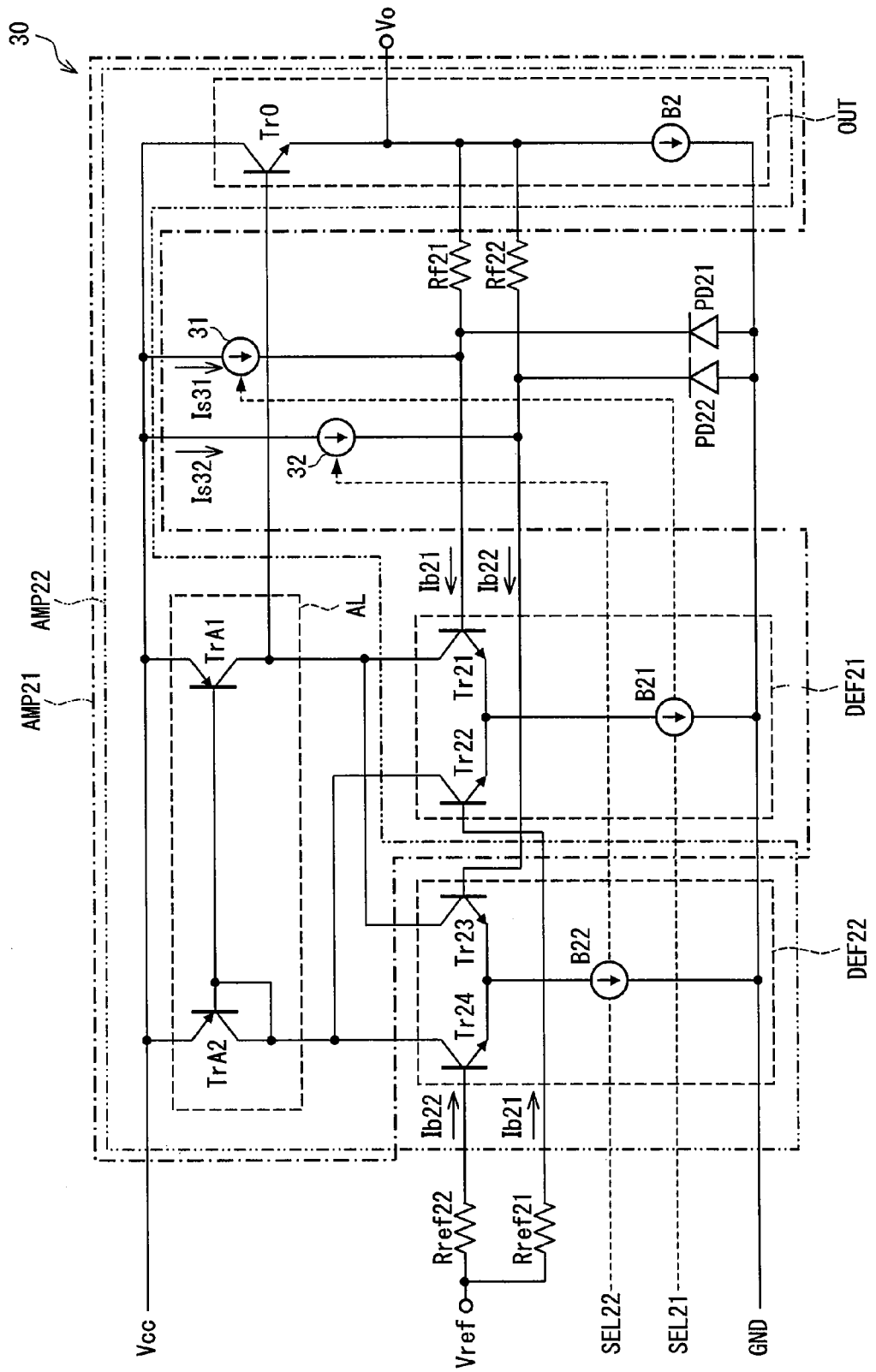
FIG. 10 is a circuit diagram showing a detailed structure of the photoreceiver/amplifier circuit of FIG. 9.

As shown in FIGS. 9 and 10, the photoreceiver/amplifier circuit 30 includes photodiodes PD21 and PD22, differential amplifier circuits AMP1 and AMP2, a feedback resistor Rf1, and a reference resistor Rref1, as with the photoreceiver/amplifier circuit 20. The photoreceiver/amplifier circuit 30 includes compensation circuits 31 and 32 instead of the compensation circuits 21 and 22, and includes switches SW31 and SW32 instead of switches SW23 and SW24.

Unlike the compensation circuit 21, the compensation circuit 31 supplies a compensation current Is31 (described later) into a junction P31 between the feedback resistor Rf21 and the inverting input terminal of the differential amplifier circuit AMP21, so as to compensate the difference between a voltage between terminals of the feedback resistor Rf21 and a voltage between terminals of the reference resistor Rref21. Meanwhile, unlike the compensation circuit 22, the compensation circuit 32 supplies a compensation current Is32 (described later) into a junction P32 between the feedback resistor Rf22 and the inverting input terminal of the differential amplifier circuit AMP22, so as to compensate the difference between a voltage between terminals of the feedback resistor Rf22 and a voltage between terminals of the reference resistor Rref22. The compensation currents Is31 and Is32 are denoted by the following formula.

$$Is31 = (1 - Rref21/Rf21) \times Ib21 \quad (40)$$

$$Is32 = (1 - Rref22/Rf22) \times Ib22 \quad (41)$$

The compensation circuits 31 and 32 are substantially identical in structure to the compensation circuit 12 shown in FIG. 6, except for the supply of compensation currents Is31 and Is32. The detailed explanation of the compensation circuits 31 and 32 is therefore omitted here.

Further, the switch SW31 is provided between the compensation circuit 31 and the junction P31. The switch SW31 is a ON/OFF switch controlled by the control signal SLE21, and is turned on or off in synchronism with the switch SW21. The switch SW32 is provided between the compensation circuit 32 and the junction P32. The switch SW32 is a ON/OFF switch controlled by the control signal SLE22, and is turned on or off in synchronism with the switch SW22.

In the photoreceiver/amplifier circuit 30 having the foregoing structure, to reproduce a CD for example, the switches SW21 and SW31 are turned on. As a result, the differential amplifier circuit AMP21 is brought into operation, and the compensation circuit 31 supplies the compensation current Is 31 from the junction P31. At this time, by turning off the switches SW22 and SW32, the operation of the differential amplifier circuit AMP22 is stopped, and the supply of the compensation current Is 32 from the junction P32 by the compensation circuit 32 is suspended.

In the meantime, to reproduce a DVD for example, the switches SW22 and SW32 are turned on. As a result, the differential amplifier circuit AMP22 is brought into operation, and the compensation circuit 32 supplies the compensation current Is 32 from the junction P32. At this time, by turning off the switches SW21 and SW31, the operation of the differential amplifier circuit AMP21 is stopped, and the supply of the compensation current Is 31 from the junction P31 by the compensation circuit 31 is suspended.

As described, in the photoreceiver/amplifier circuit 30, as with the photoreceiver/amplifier circuit 20, one of the differential amplifier circuits AMP21 and AMP22 is brought into operation, and one of the reception signals of the photodiodes PD21 and PD22 is selectively subjected to I-V conversion. Further, during operations of the differential amplifier circuits AMP21 and AMP22, the difference between the voltage between terminals of the feedback resistor Rf21 and the voltage between terminals of the reference resistor Rref21 is compensated by the compensation currents Is 31 and Is 32 from the compensation circuits 31 and 32. Consequently, the offset voltage is nulled. At this time, the flow rates of the compensation currents are adjusted according to their bias currents of the bias circuits B21 and B22, the gain resistors, and the reference resistor ratios (Rf21/Rref21, Rf22/Rref22).

As described, as with the photoreceiver/amplifier circuit 20, the photoreceiver/amplifier circuit 30 is arranged such that the resistances of the feedback resistors Rf21 and Rf22, and the resistances of the reference resistors Rref21 and Rref 22 satisfy: Rf21>Rref21. With this arrangement, the photoreceiver/amplifier circuit 30 achieves noise reduction. Moreover, with the provision of the compensation circuits 31 and 32, the photoreceiver/amplifier circuit 30 is capable of changing the noise characteristic according to the wavelength of signal light or the gain, when the feedback resistors Rf21 and Rf22 (feedback resistor) are selectively operated according to the wavelength of signal light. The photoreceiver/amplifier circuit 20 also ensures desirable offset voltage characteristics according to the feedback resistors Rf21 and Rf22.

Fifth Embodiment

Still another embodiment of the present invention is described below with reference to FIGS. 11 and 12. For ease of explanation, materials having the equivalent functions as those shown in the drawings pertaining to the foregoing Third Embodiment will be given the same reference symbols, and explanation thereof will be omitted here.

Figure 11:
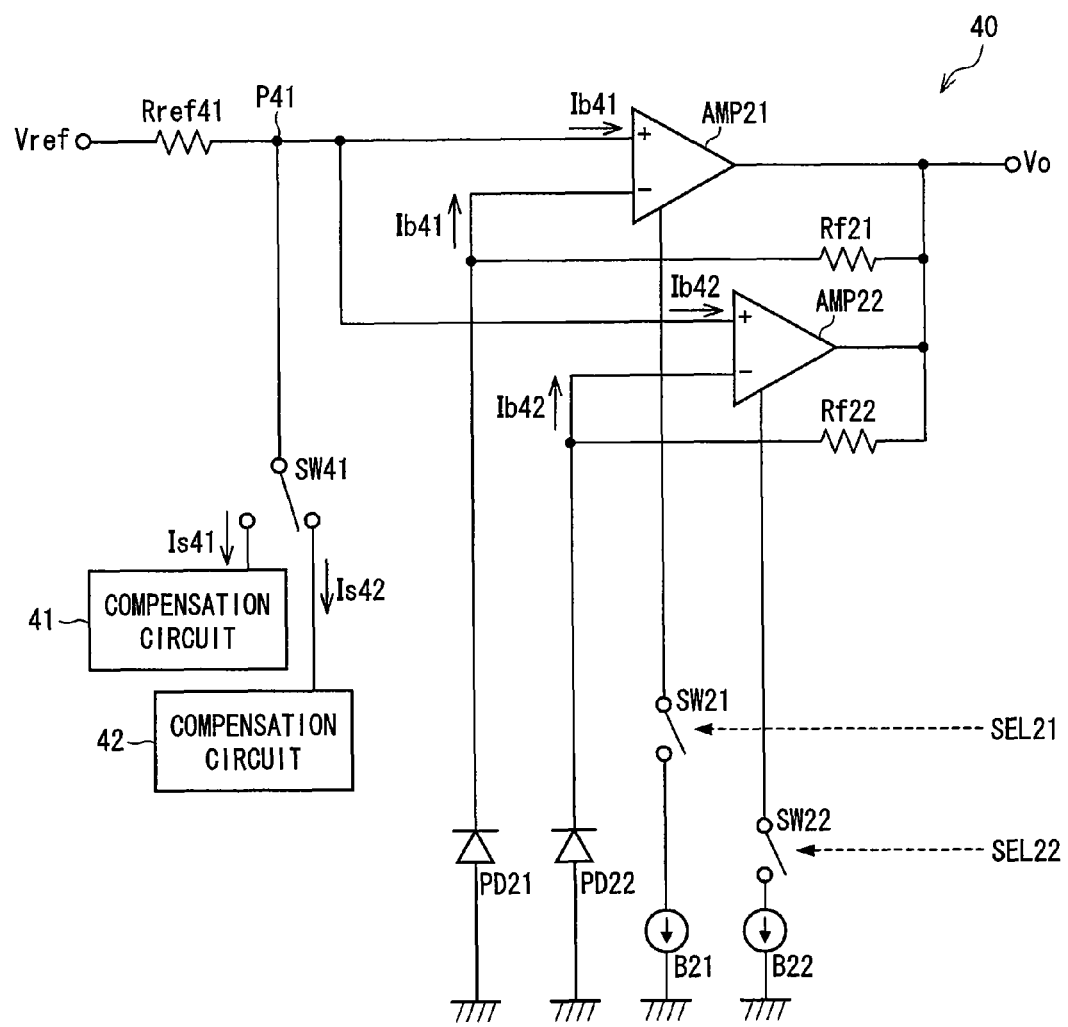
FIG. 11 is a circuit diagram showing a schematic structure of a photoreceiver/amplifier circuit according to Fifth Embodiment of the present invention.
Figure 12:
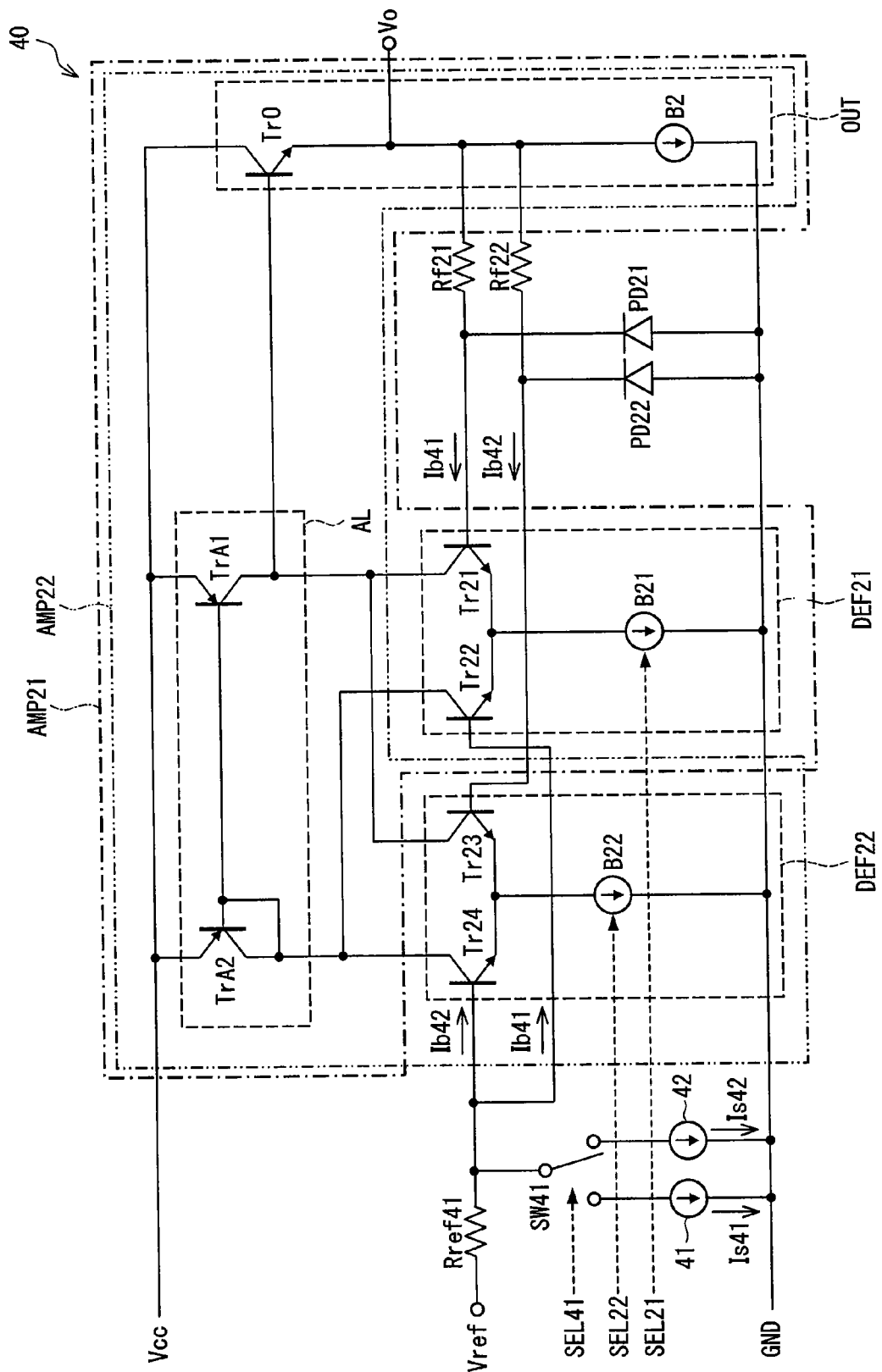
FIG. 12 is a circuit diagram showing a detailed structure of the photoreceiver/amplifier circuit of FIG. 11.

FIG. 11 is a schematic structure showing a photoreceiver/amplifier circuit 40 according to the present embodiment. FIG. 12 shows a detailed structure of the photoreceiver/amplifier circuit 40.

The photoreceiver/amplifier circuit 40 is used as each of the photoreceiver/amplifier circuits 101A to 101D shown in FIG. 20, and amplifies photocurrents generated in the photodiodes PDA to PDD and PDa to PDd of FIG. 19 by converting them into voltages. Note that, as shown in FIG. 11, a common reference resistor Rref41 is provided for each pair of photodiode PDA and PDa etc.

As shown in FIG. 11, the photoreceiver/amplifier circuit 40 includes photodiodes PD21 and PD22, differential amplifier circuits AMP21 and AMP22, feedback resistors Rf21 and Rf22, a reference resistor Rref41, and compensation circuits 41 and 42.

One end of the reference resistor Rref41 is supplied with the reference voltage Vref, and the other end is connected to the non-inverting input terminal of the differential amplifier circuit AMP21.

The compensation circuit 41 supplies a compensation current Is 41 (described later) from a junction P41 of the reference resistor Rref41 and the non-inverting input terminal of the differential amplifier circuit AMP21 so as to compensate the difference between a voltage between terminals of the feedback resistor Rf21 and a voltage between terminals of the reference resistor Rref41. Meanwhile, the compensation circuit 42 supplies a compensation current Is 42 (described later) from a junction P41 so as to compensate the difference between a voltage between terminals of the feedback resistor Rf22 and a voltage between terminals of the reference resistor Rref41.

Further, the switch SW41 is provided between the compensation circuits 41 and 42 and the junction 41. The switch SW41 is a switch controlled by the control signal SLE41, and is turned on or off in synchronism with the switches SW21 and SW22 so as to cause one of the compensation circuit 41 and the compensation circuit 42 to be connected to the junction P41. More specifically, the switch 41 causes the compensation circuit 41 to be connected to the junction P41 when the switch SW21 is turned on, and causes the compensation circuit 42 to be connected to the junction P41 when the switch SW22 is turned on.

Assuming that Rf21, Rf22, and Rref41 respectively express the resistances of the feedback resistors Rf21, RF22 and the reference resistor Rref41, the resistances of the feedback resistors Rf21, Rf22 and the reference resistor Rref21 satisfy Rf21>Rref41 and Rf22>Rref41 in the photoreceiver/amplifier circuit 20.

Further, the compensation currents Is 41 and Is 42 supplied by the compensation circuits 41 and 42 are denoted by the following Formulas (42) and (43).

$$Is41=(Rf21/Rref41-1) \times Ib41 \quad (42)$$

$$Is42=(Rf22/Rref42-1) \times Ib42 \quad (43)$$

where Ib41 expresses a base current in the base of the differential transistor pair (transistors Tr21 and Tr22) of the differential circuit DEF21, and Ib42 expresses a base current which flows in the base of the differential transistor pair (transistors Tr23 and Tr24) of the differential circuit DEF22.

The compensation circuits 41 and 42 are substantially identical in structure to the compensation circuit 2 shown in FIG. 3, except for the supply of compensation currents Is 41 and Is 42. The detailed explanation of the compensation circuits 41 and 42 is therefore omitted here.

In the photoreceiver/amplifier circuit 40 having the foregoing structure, to reproduce a CD for example, the switch SW21 is turned on. As a result, the differential amplifier circuit AMP21 is brought into operation, and the switch SW41 selects the compensation circuit 41 so that the compensation circuit 41 supplies the compensation current Is 41 from the junction P41. At this time, the operation of the differential amplifier circuit AMP22 is stopped, and the supply of the compensation current Is 42 from the junction P41 by the compensation circuit 42 is suspended.

In the meantime, to reproduce a DVD for example, the switch SW22 is turned on. As a result, the differential amplifier circuit AMP22 is brought into operation, and the switch SW41 selects the compensation circuit 42 so that the compensation circuit 42 supplies the compensation current Is 42 from the junction P41. At this time, the operation of the differential amplifier circuit AMP41 is stopped, and the supply of the compensation current Is 41 from the junction P41 by the compensation circuit 41 is suspended.

As described, in the photoreceiver/amplifier circuit 40, one of the differential amplifier circuits AMP21 and AMP22 is brought into operation, and one of the reception signals of the photodiodes PD21 and PD22 is selectively subjected to I-V conversion. Further, during operations of the differential amplifier circuits AMP21 and AMP22, the difference between the voltage between terminals of the feedback resistor Rf21 and the voltage between terminals of the reference resistor Rref41 is compensated by the compensation currents Is41 and Is42 from the compensation circuits 41 and 42. Consequently, the offset voltage is nulled. At this time, the flow rates of the compensation currents are adjusted according to their bias currents, and the ratio of the gain resistance to the reference resistance (Rf21/Rref41, Rf22/Rref41) of the bias circuits B21 and B22.

As described, the photoreceiver/amplifier circuit 40 is arranged such that the resistances of the feedback resistors Rf21 and Rf22, and the resistance of the reference resistors Rref41 satisfy: Rf21>Rref41, Rf22>Rref41. With this arrangement, the photoreceiver/amplifier circuit 40 achieves noise reduction. Moreover, with the provision of the compensation circuits 41 and 42, the photoreceiver/amplifier circuit 40 is capable of changing the noise characteristic according to the wavelength of signal light or the gain, when the feedback resistors Rf21 and Rf22 (gain resistor) are selectively operated according to the wavelength of signal light. The photoreceiver/amplifier circuit 20 also ensures desirable offset voltage characteristics according to the feedback resistors Rf21 and Rf22.

Note that, if the resistance of the feedback resistor Rf22 is small and a desirable noise characteristic is ensured, the photoreceiver/amplifier circuit 40 may be composed as follows.

That is, in the photoreceiver/amplifier circuit 40, the resistance of the feedback resistor Rf22 and the resistance of the reference resistor Rref41 are set to the same value, and the compensation circuit 42 is omitted, and the connection between the compensation circuit 41 and the junction P41 is turned on or off according to the selection (switching) between the differential amplifier circuits AMP21 and AMP22. This structure also ensures an appropriate offset characteristic corresponding to the selected differential amplifier circuit AMP21 or AMP22.

Further, in the photoreceiver/amplifier circuit 40 according to the present embodiment, a single common reference resistor Rref41 is used for the differential amplifier circuits AMP21 and AMP22 (feedback resistors Rf21 and Rf22).

With this arrangement, the resistance is reduced in a chip having the photoreceiver/amplifier circuit 40 as a semiconductor integrated circuit. This allows reduction in chip size.

With the recent process development, the sizes of transistor elements tend to decrease.

Meanwhile, the occupied area of the resistor element in the chip is increasing because the physical characteristic of the resistor element is determined depending on the property required.

Under such a circumstance, reduction in resistance contributes to reduction in chip area, thereby reducing cost.

If the difference between the resistances of the feedback resistors Rf21 and Rf22 is small, there is no large difference between the voltages generated in the feedback resistors Rf21 and Rf22 even in the structure using a single common reference resistor Rref41. Therefore, the error in adjusting the offset characteristic is small, and there will be no defect. However, for example, if the resistance ratio of the feedback resistors Rf21 and Rf22 is 10:1 and the difference between the resistances is large, the compensation currents Is41 and Is42 of the compensation circuit 41 have to have a large difference in the structure using the single common reference resistor Rref41. In this case, the error or variation in adjusting the offset characteristic can increase.

In contrast, for example, the photoreceiver/amplifier circuits 20 and 30 shown in Third and Fourth Embodiments of the present invention include reference resistors Rref21 and Rref22 respectively corresponding to the feedback resistors Rf21 and Rf22. In this structure, the reference resistors Rref21 and Rref22 can be adjusted separately. Accordingly, it is not necessary to increase the difference between the two compensation currents of the feedback resistor Rf21 and Rf22 even when the difference between the resistances of the feedback resistors Rf21 and Rf22 is large. Consequently, more desirable offset characteristic is obtained, compared with the photoreceiver/amplifier circuit 40.

Sixth Embodiment

Yet another embodiment of the present invention is described below with reference to FIG. 13. For ease of explanation, materials having the equivalent functions as those shown in the drawings pertaining to the foregoing First Embodiment will be given the same reference symbols, and explanation thereof will be omitted here.

Figure 13:
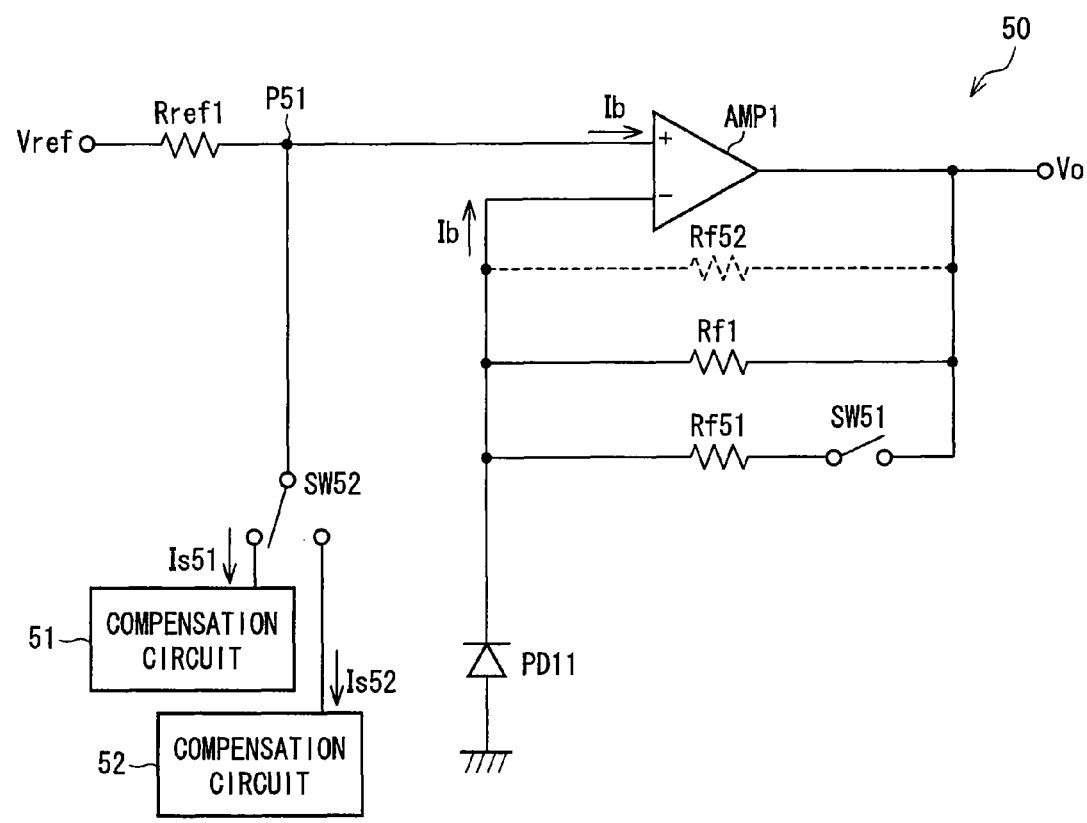
FIG. 13 is a circuit diagram showing a schematic structure of a photoreceiver/amplifier circuit according to Sixth Embodiment of the present invention.

FIG. 13 is a schematic structure showing a photoreceiver/amplifier circuit 50 according to the present embodiment.

Figure 22:
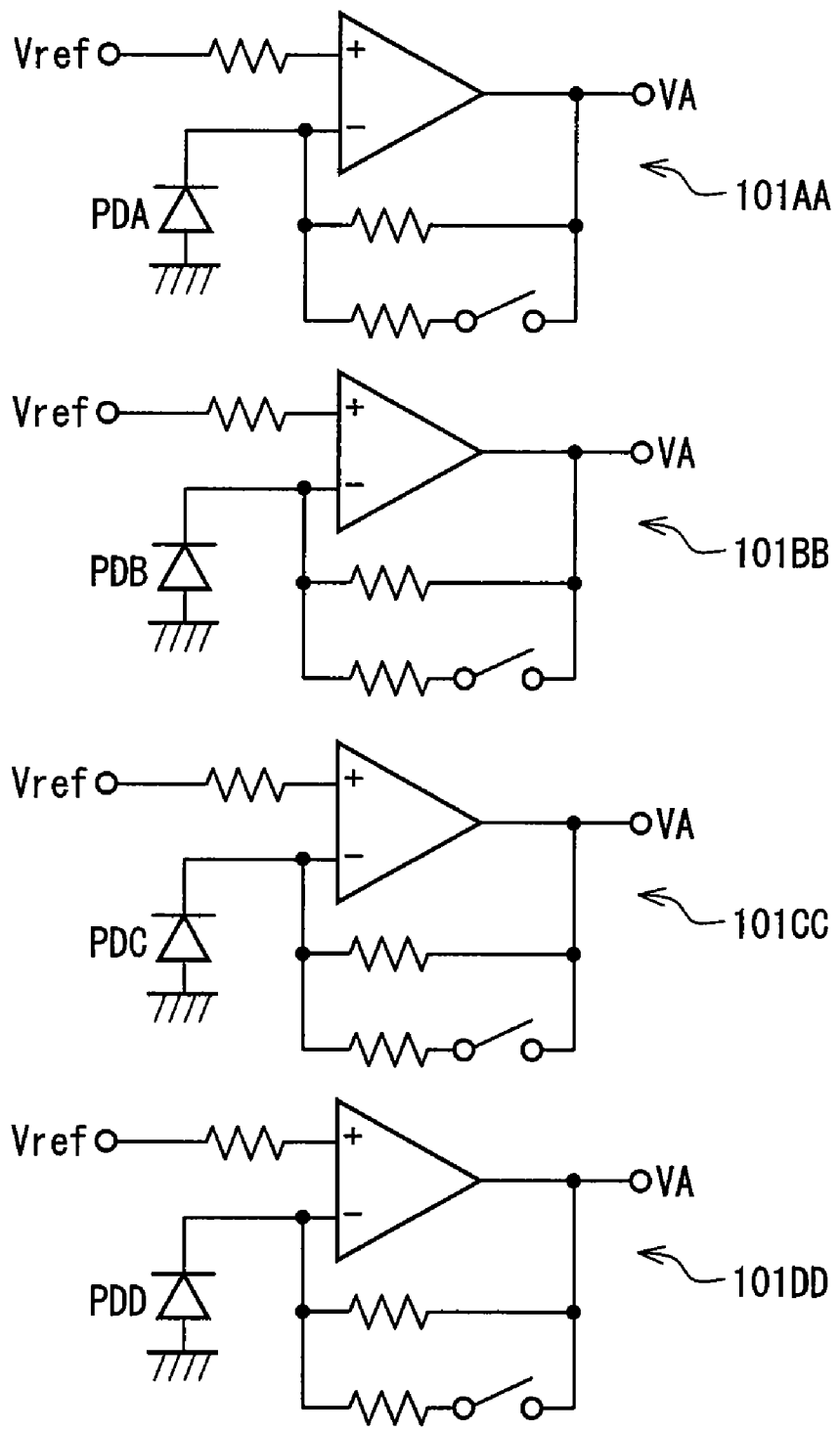
FIG. 22 is a circuit diagram showing a structure of another photoreceiver/amplifier circuits connected to the photodiodes of FIG. 16.
Figure 23:
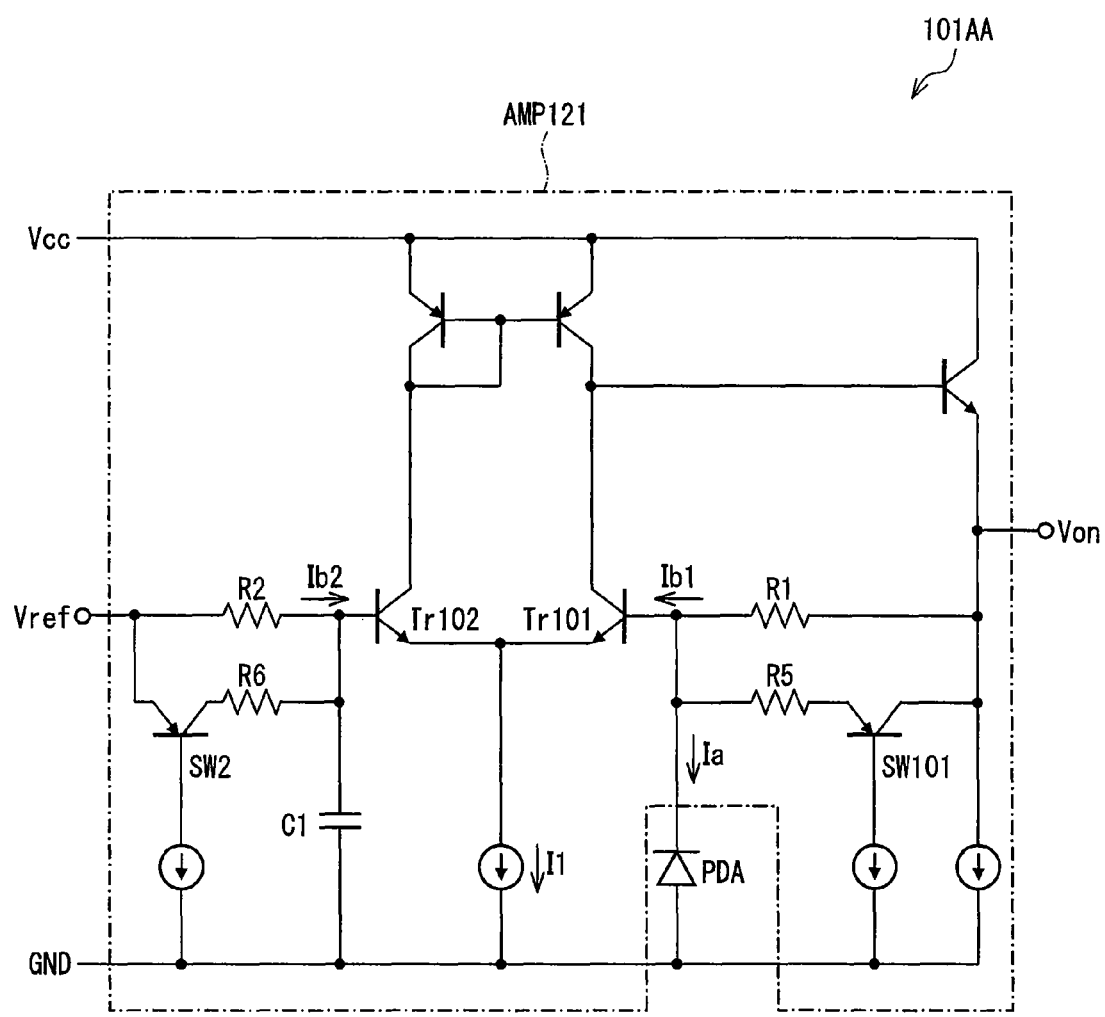
FIG. 23 is a circuit diagram showing a structure of another conventional photoreceiver/amplifier circuit corresponding to a 1-beam-type photoreceiver photodiode.

The photoreceiver/amplifier circuit 50 is used as each of the photoreceiver/amplifier circuits 101AA to 101DD shown in FIG. 22, and amplifies photocurrents generated in the photodiodes PDA to PDD by converting them into voltages.

As shown in FIG. 13, the photoreceiver/amplifier circuit 50 includes a photodiode PD1, a differential amplifier circuit AMP1, a feedback resistor Rf1, a reference resistor Rref1, an additional resistor Rf51, compensation circuits 51 and 52, and switches SW51 and SW52.

The switch SW51 is an ON/OFF switch for connecting the additional resistor Rf51 to the feedback resistor Rf1 in parallel, and for disconnecting them. The switch SW51 connects/disconnects the additional resistor Rf51 to/from the feedback resistor Rf1, thereby switching the gain of the photoreceiver/amplifier circuit 50. With this operation, the reception signal of the photodiode PD1 is selectively subjected to I-V conversion and outputted.

The switch SW52 is provided between the compensation circuits 51/52 and the junction P51.

The switch SW52 is an ON/OFF switch for causing either the compensation circuit 51 or the compensation circuit 52 to be connected to the junction P51 in synchronism with the ON/OFF operation of the switch SW51. More specifically, the switch SW52 connects the compensation circuit 51 to the junction P51 when the switch SW51 is turned off, and connects the compensation circuit 52 to the junction P51 when the switch SW51 is turned on. In the ON-state of the switch SW51, the additional resistor Rf51 and the feedback resistor Rf1 are connected in parallel, and a synthetic feedback resistor Rf52 (shown by a broken line in FIG. 13) is equivalently formed.

The compensation circuit 51 supplies a compensation current Is51 (described later) from a junction P51 of the reference resistor Rref1 and the non-inverting input terminal of the differential amplifier circuit AMP1 so as to compensate the difference between a voltage between terminals of the feedback resistor Rf1 and a voltage between terminals of the reference resistor Rref1. Meanwhile, the compensation circuit 52 supplies a compensation current Is52 (described later) from the junction P51 so as to compensate the difference between a voltage between terminals of the feedback resistor Rf1 and the additional resistor Rf51 which are connected in parallel by the switch SW51, and a voltage between terminals of the reference resistor Rref.

Assuming that Rf52 expresses the resistance of the synthetic feedback resistor Rf52, and Rf1, Rref1, and Rf51 express the resistances of the feedback resistor Rf1, the reference resistor Rref21, and the additional resistor Rf51, respectively. The following formula denotes the resistance of the synthetic feedback resistor Rf52.

$$Rf53 = Rf1 \times Rf51/(Rf1 + Rf51) \qquad (44)$$

In the photoreceiver/amplifier circuit 50, the resistance of the synthetic feedback resistor Rf52 and the resistance of the reference resistor Rref1 satisfy: Rf52>Rref1. Further, the compensation currents Is51 and Is52 supplied by the compensation circuits 51 and 52 are denoted by the following Formulas (45) and (46).

$$Is51 = (Rf1/Rref1 \times 1) \times Ib \qquad (45)$$

$$Is52 = (Rf53/Rref1 - 1) \times Ib \qquad (46)$$

where Ib expresses a base current in the base of the differential transistor pair (transistors Tr1 and Tr2) of the differential circuit DEF.

The compensation circuits 51 are completely identical in structure to the compensation circuit 2, as it supplies the compensation current Is51 which is the same as the compensation current Is1 denoted by Formula (18). The compensation circuits 52 are substantially identical in structure to the compensation circuit 2 of FIG. 3, except for the supply of compensation currents Is52. The detailed explanation of the compensation circuits 51 and 52 is therefore omitted here.

In the photoreceiver/amplifier circuit 50 having the foregoing structure, to reproduce signals, the switch SW51 is turned off and the switch SW52 selects the compensation circuit 51. As a result, the differential amplifier circuit AMP1 is brought into operation with a high gain set by the feedback resistor Rf1, and the compensation circuit 51 supplies the compensation current Is 51 from the junction P51.

Meanwhile, to write signals, the switch SW51 is turned on and the switch SW52 selects the compensation circuit 52. As a result, the differential amplifier circuit AMP1 is brought into operation with a low gain set by the parallel gain constituted of the feedback resistor Rf1 and the additional resistor Rf51, and the compensation circuit 52 supplies the compensation current Is 52 from the junction P51.

As described, in the photoreceiver/amplifier circuit 50, the differential amplifier circuit AMP1 is brought into operation with different gain settings depending on whether signals are written or reproduced. As a result, a reception signal of a different light quantity is selectively subjected to I-V conversion depending on whether signals are written or reproduced, and the converted signal is outputted, Further, during operations of the differential amplifier circuit AMP1 with each gain, the difference between the voltage between terminals of the feedback resistor Rf1 and the voltage between terminals of the reference resistor Rref1, and the difference between the voltage between terminals of the synthetic feedback resistor and the voltage between terminals of the reference resistor Rref1 are compensated by the compensation currents Is51 and Is52 from the compensation circuits 51 and 52. Consequently, the offset voltage is nulled. At this time, the flow rates of the compensation currents are adjusted according to the ratio of the gain resistance to the reference resistor.

As described, the photoreceiver/amplifier circuit 50 is arranged such that the resistances of the feedback resistor Rf1 and the synthetic feedback resistor Rf52, and the resistance of the reference resistor Rref21 satisfy: Rf1>Rref1, Rf52>Rref1. With this arrangement, the photoreceiver/amplifier circuit 50 achieves noise reduction. Moreover, with the provision of the compensation circuits 51 and 52, the photoreceiver/amplifier circuit 50 is capable of switching the changing the feedback resistor Rf1 and the synthetic feedback resistor for different signal light quantities, and thereby changes the noise characteristic according to the light quantity of signal light or the gain. The photoreceiver/amplifier circuit 50 also ensures desirable offset voltage characteristics according to the feedback resistor Rf1 and the synthetic feedback resistor Rf52.

Note that, if the resistance of the feedback resistor Rf52 is small and a desirable noise characteristic is ensured, the photoreceiver/amplifier circuit 50 may be composed as follows.

That is, in the photoreceiver/amplifier circuit 50, the resistance of the feedback resistor Rf52 and the resistance of the reference resistor Rref51 are set to the same value, and the compensation circuit 52 is omitted, and the connection between the compensation circuit 51 and the junction P51 is turned on or off according to the selection (switching) of the gain. This structure also ensures an appropriate offset characteristic corresponding to the selected gain.

Seventh Embodiment

Still another embodiment of the present invention is described below with reference to FIG. 14. For ease of explanation, materials having the equivalent functions as those shown in the drawings pertaining to the foregoing First Embodiment will be given the same reference symbols, and explanation thereof will be omitted here.

Figure 14:
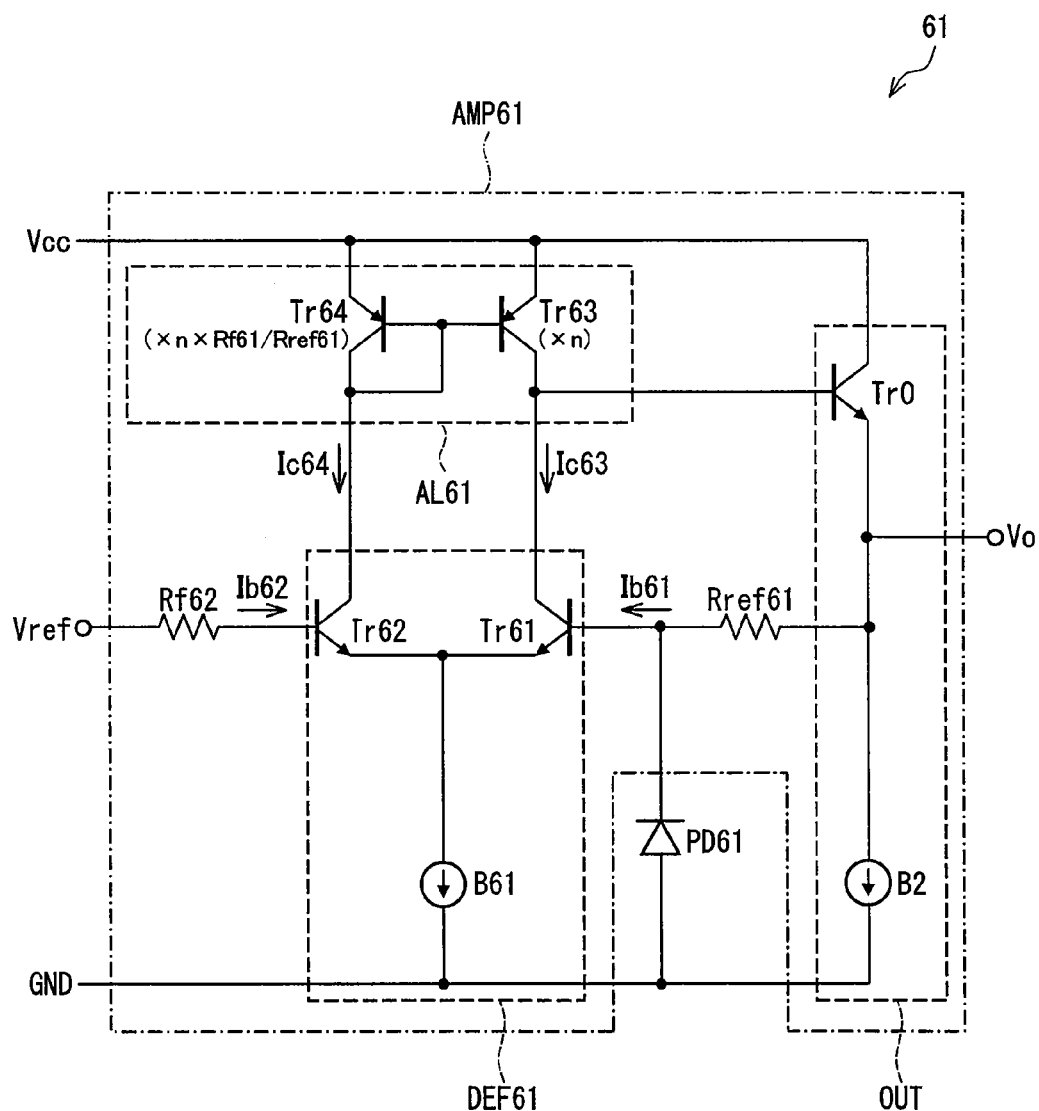
FIG. 14 is a circuit diagram showing a schematic structure of a photoreceiver/amplifier circuit according to Seventh Embodiment of the present invention.

FIG. 14 is a schematic structure showing a photoreceiver/amplifier circuit 61 according to the present embodiment.

The photoreceiver/amplifier circuit 61 is used as each of the photoreceiver/amplifier circuits 101a to 101d shown in FIG. 17, and amplifies photocurrents generated in the photodiodes PDA to PDD by converting them into voltages.

In the photoreceiver/amplifier circuit 61, the differential amplifier circuit AMP61 serves to amplify a voltage resulting from conversion of photocurrent Ib61 in the photodiode PD61 as shown in FIG. 14. The cathode of the photodiode PD61 is connected to an inverting input terminal (base of the later-described transistor Tr61) of the differential amplifier circuit AMP61. The feedback resistor Rf61 is provided between an output terminal and an inverting input terminal (base of the later-described transistor Tr62) of the differential amplifier circuit AMP61. One end of the reference resistor Rref61 is supplied with a reference voltage Vref, while the other end is connected to a non-inverting input terminal of the differential amplifier circuit AMP61.

Assuming that Rf61 and Rref61 respectively express the resistances of the feedback resistor Rf61 and the reference resistor Rref61, the resistances of the feedback resistor Rf61 and the reference resistor Rref61 satisfy Rf61>Rref61 in the photoreceiver/amplifier circuit 61.

The differential amplifier circuit AMP61 further includes a differential circuit DEF61, an active load AL61, and an output circuit OUT.

The differential circuit DEF61 is constituted of NPN-type transistors Tr61 and Tr62, and a bias circuit B61. The transistors Tr61 and Tr62 form a differential transistor pair of the differential circuit DEF61, and their emitters are both connected to one end of the bias circuit B61. The bias circuit B61 serves as a constant current circuit for keeping a bias current constant. The bias current is a sum of the current in the transistor Tr61 and the current in the transistor Tr62. The other end of the bias circuit B61 is connected to a ground line. The bias circuit B61 is composed of a NPN-type transistor (bias transistor). The bias circuit B61 is not shown in the figure.

The active load AL61 is composed of PNP-type transistors Tr63 and Tr64. The bases of the transistor Tr63 and Tr64 are connected to each other to be further connected to a collector of the transistor Tr64. With such a structure, the transistors Tr63 and Tr64 compose a current mirror circuit. Further, the emitters of the transistors Tr63 and Tr64 are connected to a power supply line.

The active load AL61 having such a structure includes compensating means for compensating the difference between voltage between terminals of the feedback resistor Rf61 and the voltage between terminals of the reference resistor Rref61. Therefore, using the transistors Tr63 and Tr64, the active load AL61 supplies to the transistors Tr61 and Tr62 a current corresponding to the resistance ratio (Rf61/Rref61) of the feedback resistor Rf61 to the reference resistor Rref61.

Assuming that the base currents of the transistors Tr61 to Tr62 are respectively expressed as Ib61 to Ib62, and the collector currents of the transistors Tr63 and Tr64 are respectively expressed as Ic63 and Ic64, and hfe expresses a common transistor hfe for all of the transistors Tr61 to Tr63, the relationship between the collector currents Ic63, Ic64 and the base currents Ib61, Ib62 is denoted by Formula (48) through Formula (50).

$$Ic64 = Ic63 \times Rf61/Rref61 \tag{48}$$

$$Ib61 = Ic63/hfe \tag{49}$$

$$Ib62 = Ic64/hfe = Ic63 \times Rf61/Rref61/hfe \tag{50}$$

The voltage VRf61 generated between terminals of the feedback resistor Rf61 is denoted by the following formula.

$$VRf61 = Rf61 \times Ib61 = Rf61 \times Ic63/hfe \tag{51}$$

Further, the voltage VRref61 generated between the terminals of the reference resistor Rref61 is denoted by the following formula, if the active load AL61 has compensating means.

$$VRref61 = Rref61 \times Ib62 \quad (52)$$
$$= Rref61 \times (Ic63 \times Rf61/Rref61/hfe)$$
$$= Rf61 \times Ic63/hfe$$

Therefore, the difference of the voltage between terminals is denoted by the following formula.

$$VRf61 - VRref61 = 0 \quad (53)$$

As shown in the formula, the difference between the voltage between terminals of the feedback resistor Rf61 and the voltage between terminals of the reference resistor Rref61 is cancelled, and the offset voltage is nulled.

As described, since the resistance of the feedback resistor Rf61 and the resistance of the reference resistor Rref61 satisfy the relationship: Rf61>Rref61, the noise can be reduced. Moreover, with the provision of the active load AL61 having compensating means, the photoreceiver/amplifier circuit 61 ensures a desirable offset characteristic. Furthermore, since the compensation circuit 1, such as the foregoing photoreceiver/amplifier circuit 1, is not required to be added, the circuit structure of the photoreceiver/amplifier circuit 61 can be simplified.

Eighth Embodiment

Yet another embodiment of the present invention is described below with reference to FIGS. 24 and 25. For ease of explanation, materials having the equivalent functions as those shown in the drawings pertaining to the foregoing First Embodiment will be given the same reference symbols, and explanation thereof will be omitted here.

Figure 24:
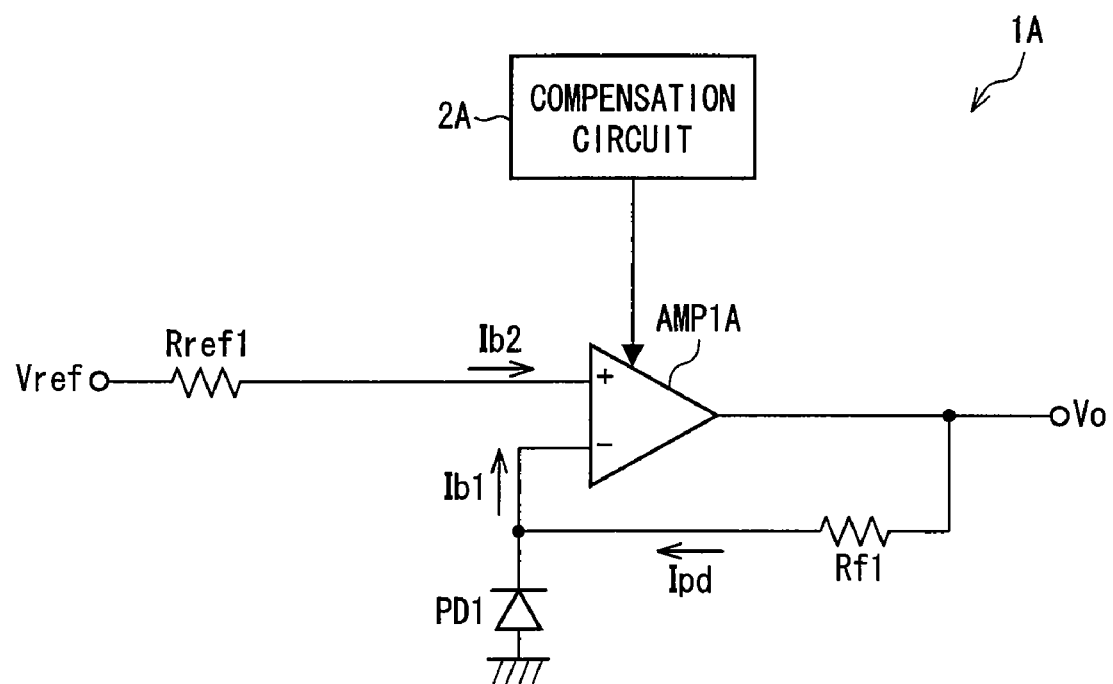
FIG. 24 is a circuit diagram showing a schematic structure of a photoreceiver/amplifier circuit according to Eighth Embodiment of the present invention.

FIG. 24 shows a schematic structure showing a photoreceiver/amplifier circuit 1A according to the present embodiment. FIG. 25 shows a detailed circuit structure of the photoreceiver/amplifier circuit 1A.

The photoreceiver/amplifier circuit 1A is used as each of the photoreceiver/amplifier circuits 101AA to 101DD shown in FIG. 22, and amplifies photocurrents generated in the photodiodes PDA to PDD by converting them into voltages.

As shown in FIG. 24, the photoreceiver/amplifier circuit 1A includes a photodiode PD1, a differential amplifier circuit AMP1A, a feedback resistor Rf1, a reference resistor Rref1 and a compensation circuit 2A.

In the photoreceiver/amplifier circuit 1A, the differential amplifier circuit AMP1A serves to amplify a voltage resulting from conversion of photocurrent Ipd in the photodiode PD1. The cathode of the photodiode PD1 is connected to an inverting input terminal of the differential amplifier circuit AMP1A. The feedback resistor Rf1 is provided between an output terminal and an inverting input terminal of the differential amplifier circuit AMP1A. One end of the reference resistor Rref1 is supplied with a reference voltage Vref, while the other end is connected to a non-inverting input terminal of the differential amplifier circuit AMP1A. When no signal is supplied (Ipd=0), the current Ib1 flows in the feedback resistor Rf1, and the current Ib2 flows in the reference resistor Rref1.

The compensation circuit 2A corrects the currents Ib1 and Ib2 (described later) so as to compensate the difference between voltage between terminals of the feedback resistor Rf1 and voltage between terminals of the reference resistor Rref1. As shown in FIG. 25, the compensation circuit 2A includes resistors Re1 and Re2 so as to correct the currents Ib1 and Ib2.

Figure 25:
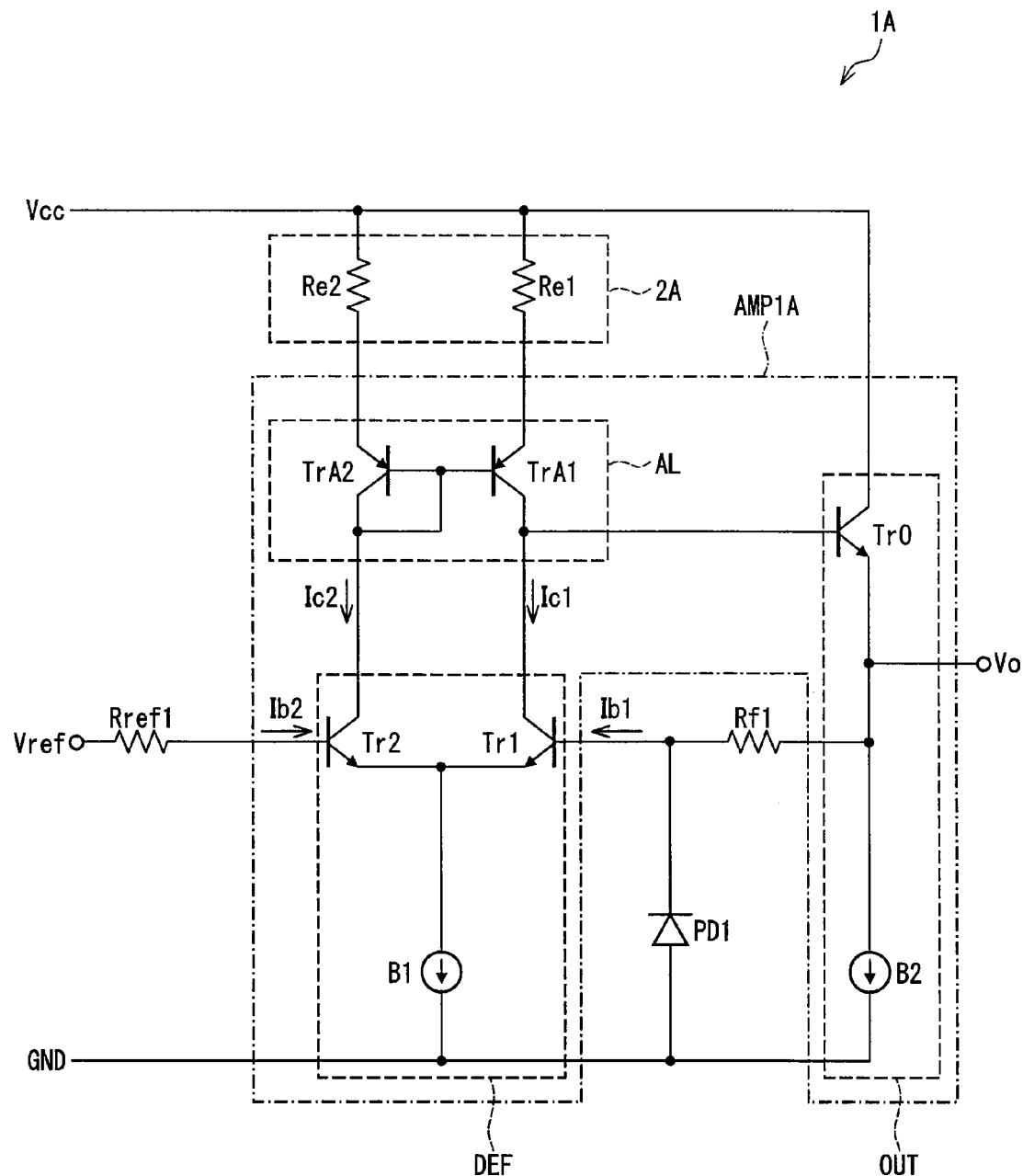
FIG. 25 is a circuit diagram showing a detailed structure of the photoreceiver/amplifier circuit of FIG. 24.

As shown in FIG. 25, the differential amplifier circuit AMP1A includes a differential circuit DEF, an active load AL and an output circuit OUT.

The emitters of the transistors TrA1 and TrA2 of the active load AL are connected to a power supply line (power supply voltage Vcc) via resistors Re1 and Re2.

Note that, the base of the transistor Tr1 serves as an inverting input terminal of the differential amplifier circuit AMP1A, and the base of the transistor Tr2 serves as a non-inverting input terminal of the differential amplifier circuit AMP1A.

Assuming that Rf1 and Rref1 respectively express the resistances of the feedback resistor Rf1 and the reference resistor Rref1, and Re1 and Re2 respectively express the resistances of the resistors Re1 and Re2, the resistances of the feedback resistor Rf1 and the reference resistor Rref1 satisfy Rf1>Rref1 in the photoreceiver/amplifier circuit 1A.

The compensation circuit 2A is required to satisfy the following formula.

$$Ib2 \times Rref1 = Ib1 \times Rf1 \quad (54)$$

The hfe here is a hfe of the NPN transistor, the following formula is satisfied according to Formula (54).

$$Ic2/hfe \times Rref1 = Ic1/hfe \times Rf1 \quad (55)$$

To satisfy Formula (54), it is necessary to adjust the collector currents Ic1 and Ic2 of the transistors Tr1 and Tr2 constituting the differential pair.

If the base currents of the transistors TrA1 and TrA2a and the base current of the transistor TrO are not taken into account, the collector currents Ic1 of the transistor Tr1 and the transistor TrA1, and the collector currents Ic2 of the transistor Tr2 and the transistor TrA2 are equal. As to the collector currents Ic1 and Ic2, the following formula is satisfied.

$$VT \times \ln(Ic2/Isat) + Re2 \times Ic2 = VT \times \ln(Ic1/Isat) + Re1 \times Ic1 \quad (56)$$

Therefore, the resistances Re1 and Re2 are set to satisfy Formula (55) and Formula (56).

Consequently, the voltage difference between voltage between terminals of the feedback resistor Rf1 and the voltage between terminals of the reference resistor Rref1 is corrected, and a desirable offset characteristic is ensured.

Here, the VT is denoted by: VT=k·T/q, where k, q, T, and Isat express Boltzmann constant, electron charge amount, absolute temperature, and saturation current in PN junction, respectively.

Ninth Embodiment

Yet another embodiment of the present invention is described below with reference to FIGS. 26 and 27. For ease of explanation, materials having the equivalent functions as those shown in the drawings pertaining to the foregoing Third Embodiment will be given the same reference symbols, and explanation thereof will be omitted here.

Figure 26:
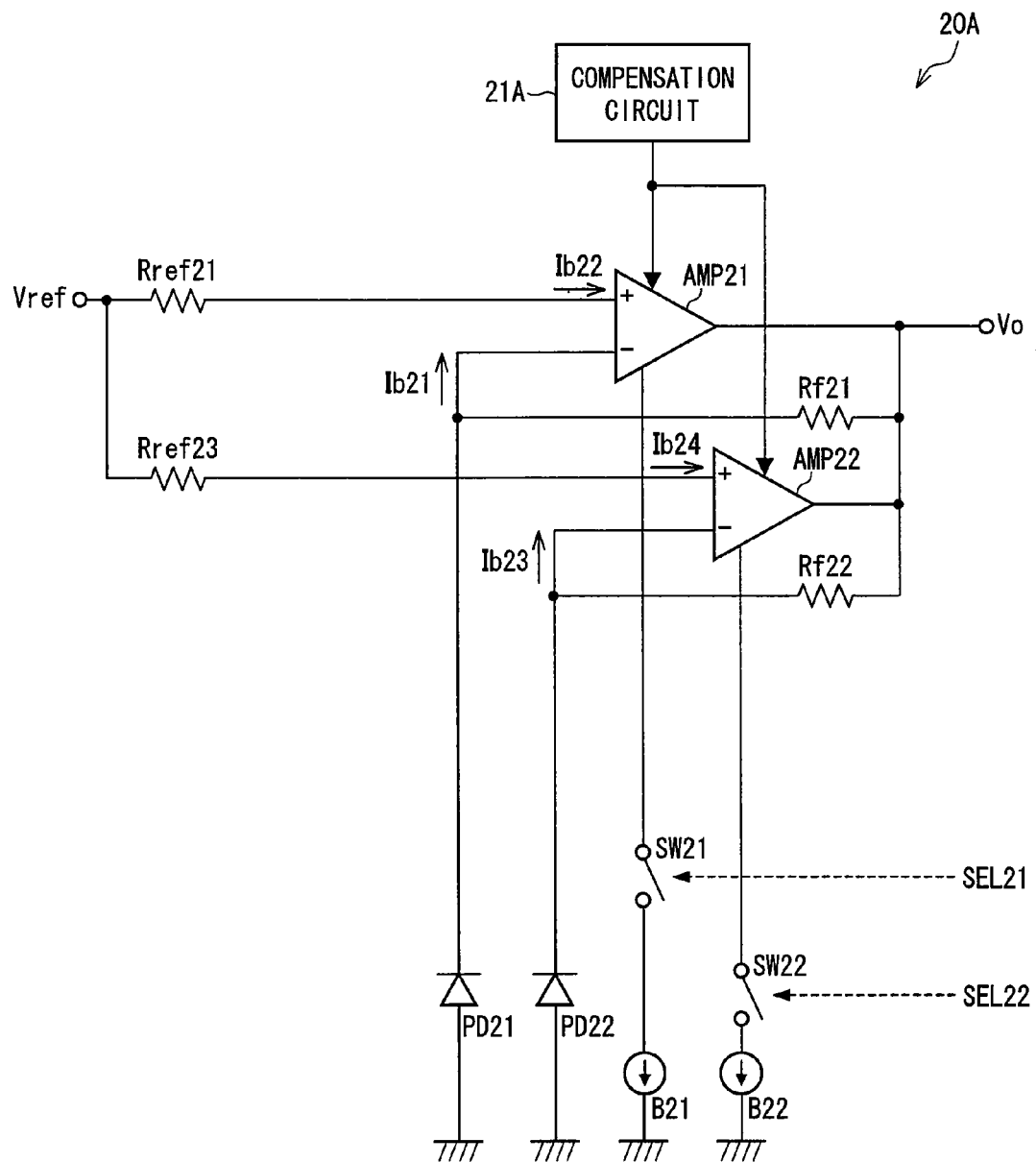
FIG. 26 is a circuit diagram showing a schematic structure of a photoreceiver/amplifier circuit according to Ninth Embodiment of the present invention.

FIG. 26 is a schematic structure showing a photoreceiver/amplifier circuit 20A according to the present embodiment. FIG. 27 is a detailed circuit structure of the photoreceiver/amplifier circuit 20A.

The photoreceiver/amplifier circuit 20A is used as each of the photoreceiver/amplifier circuits 101A to 101D shown in FIG. 20, and amplifies photocurrents generated in the photodiodes PDA to PDD and PDa to PDd by converting them into voltages.

As shown in FIG. 26, the photoreceiver/amplifier circuit 20A includes photodiodes PD21 and PD22, differential amplifier circuits AMP21 and AMP22, feedback resistors Rf21 and Rf23, reference resistors Rref21 and Rref23 and a compensation circuit 21A.

The compensation circuit 21A adjusts the base current of the transistors Tr21 to Tr24 so as to compensate the difference between the voltage between terminals of the feedback resistor Rf21 and the voltage between terminals of the reference resistor Rref21, and the difference between the voltage between terminals of the feedback resistor Rf23 and the voltage between terminals of the reference resistor Rref23.

The compensation circuit 21A adjusts the base currents (currents Ib21,Ib22) of the transistors Tr21 and Tr22, and the base currents (currents Ib23,Ib24) of the transistors Tr23 and Tr24, so as to compensate the difference between the voltage between terminals of the feedback resistor Rf21 and the voltage between terminals of the reference resistor Rref21, and the difference between the voltage between terminals of the feedback resistor Rf23 and the voltage between terminals of the reference resistor Rref23. As shown in FIG. 27, the compensation circuit 21A has resistors Re1 and Re2 for compensating the currents Ib21 to Ib24.

Figure 27:
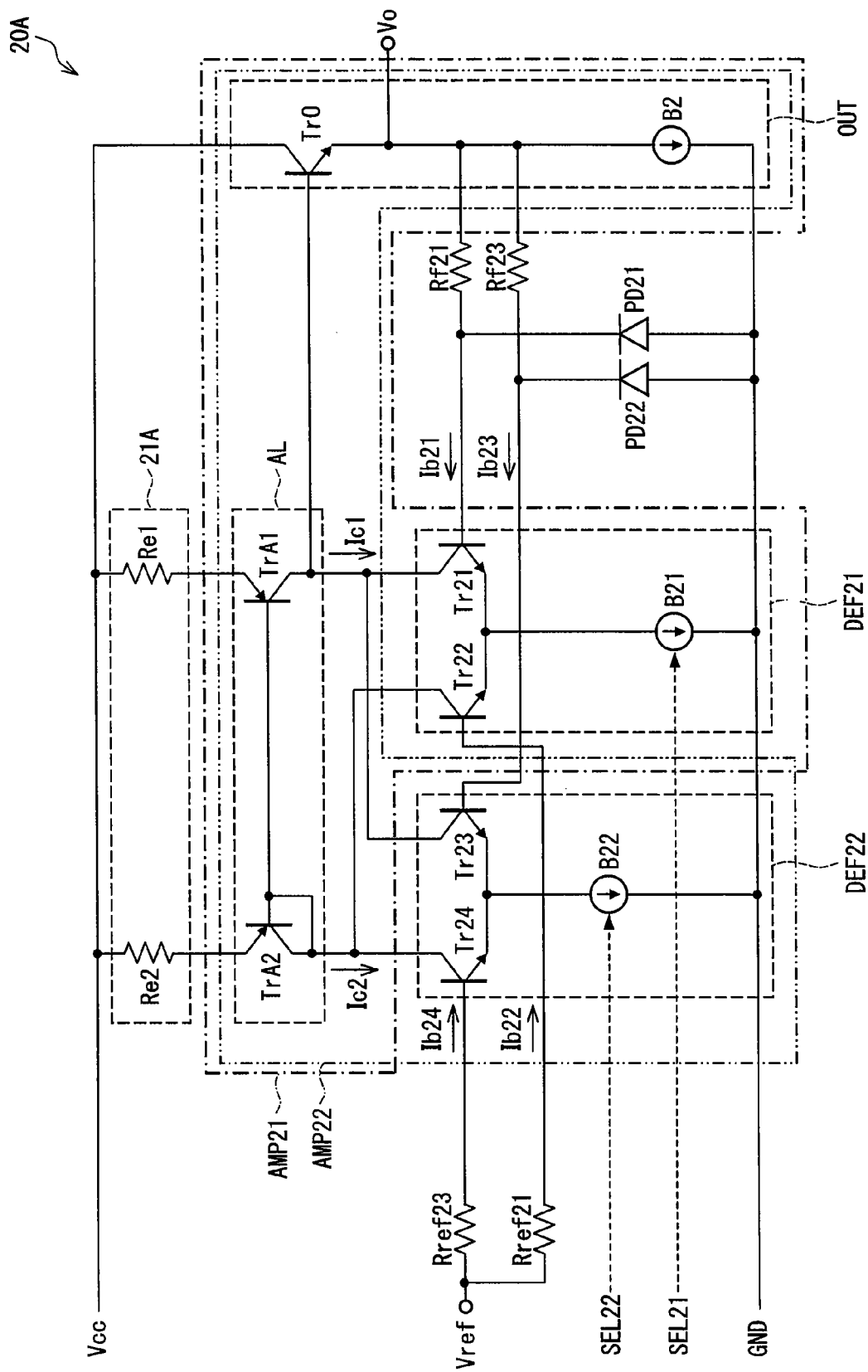
FIG. 27 is a circuit diagram showing a detailed structure of the photoreceiver/amplifier circuit of FIG. 26.

As shown in FIG. 27, the differential amplifier circuit AMP21 includes a differential circuit DEF21, an active load AL and an output circuit OUT. The differential amplifier circuit AMP22 includes a differential circuit DEF22, an active load AL and an output circuit OUT.

Unlike the photoreceiver/amplifier circuit 20 (see FIG. 8), the differential amplifier circuit AMP22 of the photoreceiver/amplifier circuit 20A serves to amplify a voltage resulting from conversion of photocurrent Ib23 in the photodiode PD22. The feedback resistor Rf23 is provided between an output terminal and an inverting input terminal of the differential amplifier circuit AMP22. One end of the reference resistor Rref23 is supplied with a reference voltage Vref, and the other is connected to the non-inverting input terminal of the differential amplifier circuit AMP22.

The emitters of the transistors TrA1 and TrA2 of the active load AL are connected to the power supply line (power supply voltage Vcc) via the resistors Re1 and Re2.

Here, Rf21 and Rref21 express resistances of the feedback resistor Rf21 and the reference resistor Rref21, respectively. Further, Rf23 and Rref23 express resistances of the feedback resistor Rf23 and the reference resistor Rref23, Re1 and Re2 express resistances of the resistors Re1 and Re2, respectively. In the photoreceiver/amplifier circuit 20A, the resistances of the feedback resistor Rf21 and the resistance of the reference resistor Rref21 satisfy: Rf21>Rref21.

Further, the resistance of the feedback resistor Rf23 and the resistance of the reference resistor Rref23 satisfy: Rf23>Rref23.

Further, the compensation circuit 21A is required to satisfy the following formula in a ON-state of the bias circuit B21.

$$Ib22 \times Rref21 = Ib21 \times Rf21 \quad (57)$$

The hfe here is a hfe of the NPN transistor, the following formula is satisfied according to Formula (57).

$$Ic2/hfe \times Rref21 = Ic1/hfe \times Rf21 \quad (58)$$

To satisfy Formula (57), it is necessary to adjust the collector currents of the transistors Tr21 and Tr22.

Further, the compensation circuit 21A is required to adjust the collector current of the transistor Tr23 and the collector current of the transistor Tr24 to satisfy the following formula in a ON-state of the bias circuit B22.

$$Ib24 \times Rref23 = Ib23 \times Rf23 \quad (59)$$

Therefore, in the photoreceiver/amplifier circuit 20A, the voltages VRF21, VRF23 and voltages VREF21, VREF23 are generated respectively in the feedback resistors Rf21, Rf23 and the reference resistors Rref21, Rref23 in operation. In this case, Re1 and Re2 need to be set to meet: VRF21−VREF21=VRF23−VREF23. With this arrangement, the correction circuit 21A can be used as a common circuit.

For example, in a ON-state of the bias circuit B21, if the base currents of the transistors TrA1 and TrA2a and the base current of the transistor TrO are not taken into account, the collector currents Ic1 of the transistor Tr21 and the transistor TrA1, and the collector currents Ic2 of the transistor Tr22 and the transistor TrA22 are equal. As to the collector currents Ic1 and Ic2, the following formula is satisfied. Therefore, the resistances Re1 and Re2 are set to meet the Formula (58) and Formula (60).

$$VT \times \ln(Ic2/Isat) + Re2 \times Ic2 = VT \times \ln(Ic1/Isat) + Re1 \times Ic1 \quad (60)$$

Consequently, the voltage difference between the voltage between terminals of the feedback resistor Rf21 and the voltage between terminals of the reference resistor Rref21 is corrected, and a desirable offset characteristic is ensured.

Further, the resistances of the feedback resistors Rf21, Rf23 and the resistances of the reference resistor Rref21, Rref23 are set to satisfy: VRF21−VREF21=VRF23−VREF23. With this arrangement, the voltage difference between the voltage between terminals of the feedback resistor Rf23 and the voltage between terminals of the reference resistor Rref23 is corrected even in a state where the bias circuit B22 is turned on by the resistors Re1 and Re2 having the same resistance. A desirable offset characteristic is thus ensured.

Tenth Embodiment

Still another embodiment of the present invention is described below with reference to FIG. 15.

Figure 15:
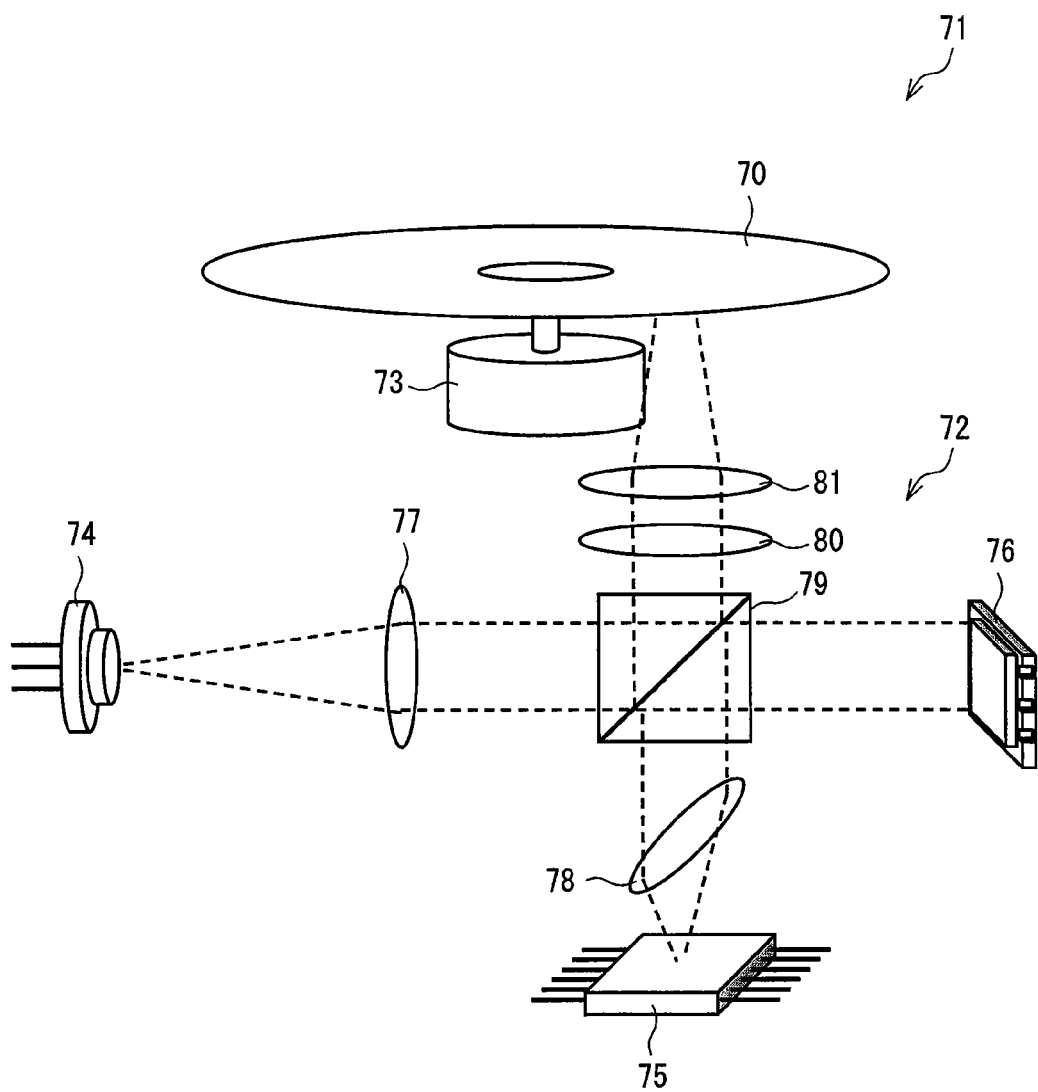
FIG. 15 is a projection view showing a schematic structure of an optical disk device according to Tenth Embodiment of the present invention.

FIG. 15 is a perspective view showing a structure of an optical disk device 71 according to one embodiment of the present invention.

As shown in FIG. 15, the optical disk device 71 includes an optical pickup device 72, a spindle motor 73 etc.

The optical pickup device 72 includes a laser diode 74, a signal-reception photoreceiver IC 75, a laser power monitoring photoreceiver IC 75, a collimator lens 77, a spot lens 78, a beam splitter 79, a collimator lens 80 and an objective lens 81.

The laser diode 74 serving as a laser light source emits a laser beam to irradiate the optical disk 70 with a laser. The driving voltage supplied to the laser diode 12 is generated in a laser driver (not shown).

When the optical disk device 71 is capable of reproduction of a certain type of optical disk 70, the laser diode 74 emits a single-wavelength laser beam. When the optical disk device 71 is capable of reproduction of two types of optical disk 70, the laser diode 74 emits laser beams of two different wavelengths, such as 780 nm laser beam for CD and 650 nm laser beam for DVD. Further, when the optical disk device 71 is capable of reproducing/writing signals to/from the optical disk 70, the laser diode 74 emits two types of laser beams of different laser powers.

The signal-reception photoreceiver IC75 has a light-receiving face on which the photodiode PD1, the photodiode PD21 and PD22 or the photodiode PD61 are provided. The signal-reception photoreceiver IC75 receives the laser beam reflected by the optical disk 70, and converts the beam as a detection signal into electric signals. The signal-reception photoreceiver IC 75 contains the photoreceiver/amplifier circuit 1, 11, 20, 30, 40, 50, 61, 1A or 20A.

The laser power monitoring photoreceiver IC75 has a light-receiving face on which a photodiode is provided, and receives a part of the laser beam emitted from the laser diode 74, and converts the beam as a detection signal into electric signals. The laser power monitoring photoreceiver IC75 includes a photoreceiver/amplifier circuit, which may be realized by the photoreceiver/amplifier circuit 1, 11, 20, 30, 40, 50, 61, 1A or 20A. Further, the position of the laser power monitoring photoreceiver IC is not limited to that shown in the figure, and the laser power monitoring photoreceiver IC may reside in anywhere as long as it can receive a laser beam of sufficient amount for detection.

In the optical pickup device 72 having the foregoing structure, the laser beam emitted from the laser diode 74 is converted into parallel rays by the collimator lens 77, before deflected by the beam splitter 79. Passing through the beam splitter 79, the laser rays further pass the collimator lens 80, and are focused onto the optical disk 70 by the objective lens 81. The laser rays reflected by the optical disk 70 pass through the objective lens 81, the collimator lens 80, and the beam splitter 79, and are focused onto the signal-reception photoreceiver IC75 by the spot lens 78. the signal-reception photoreceiver IC75 converts the laser beam into electric signals, from which the RF signals, the tracking error signals or the like are generated.

As described, in the optical pickup device 72, the signal-reception photoreceiver IC74 contains the photoreceiver/amplifier circuit 1, 11, 20, 30, 40, 50, 61, 1A or 20A which ensures noise reduction and improved offset voltage characteristic. Consequently, the qualities of the output signals of the optical pickup device 72 are improved, and the reliability of the optical pickup device 72 is improved.

The present invention is not limited to the description of the embodiments above, but may be altered by a skilled person within the scope of the claims. An embodiment based on a proper combination of technical means disclosed in different embodiments is encompassed in the technical scope of the present invention.

Summary of Embodiments

A photoreceiver/amplifier circuit according to the present invention comprises: an optical receiver; a feedback resistor; a reference resistor; a differential circuit including a differential transistor pair made up of a first transistor having a base connected to the optical receiver and to the feedback resistor, and a second transistor having a base supplied with an external reference potential via the reference resistor; and a compensation circuit for compensating a difference between voltage between terminals of the feedback resistor and a voltage between terminals of the reference resistor, wherein: a resistance of the feedback resistor is greater than a resistance of the reference resistor.

With this arrangement in which a resistance of the feedback resistor is greater than a resistance of the reference resistor, the noise from a low-frequency band can be securely reduced.

Besides, since the compensation circuit compensates a difference between the voltage between terminals of the feedback resistor and a voltage between terminals of the reference resistor, it is possible to prevent an offset voltage caused by the difference between the resistance of the feedback resistor and the resistance of the reference resistor.

The compensation circuit preferably serves as a current source for supplying a compensation current to a junction between the reference resistor and the base of the second transistor, for compensating the difference. More specifically, the compensation circuit includes: a current mirror circuit; a third transistor for supplying a bias current whose magnitude is equal to a value obtained by multiplying a bias current for driving the differential transistor pair by a 1/2 ratio of the resistance of the feedback resistor to the resistance of the reference resistor; a fourth transistor having an emitter connected to a collector of the third transistor, and a base connected to an input terminal of the current mirror circuit; and a fifth transistor for supplying a bias current whose magnitude is ½ of the bias current for driving the differential transistor pair, and having a base connected to an output terminal of the current mirror circuit. The compensation current supplied by the compensation circuit is denoted by the above-mentioned Formula (14).

The compensation circuit preferably serves as a current source for supplying a compensation current to a junction between the feedback resistor and the base of the first transistor, for compensating the difference. More specifically, the compensation circuit includes: a current mirror circuit; a third transistor for supplying a bias current whose magnitude is ½ of a bias current for driving the differential transistor pair; and a fourth transistor connected to an input terminal of the current mirror circuit, and has an emitter connected to a collector of the third transistor; and a fifth transistor for supplying a bias current whose magnitude is equal to a value obtained by multiplying the bias current for driving the differential transistor pair by a 1/2 ratio of the resistance of the feedback resistor to the resistance of the reference resistor, and having a base connected to an output terminal of the current mirror circuit. The compensation current supplied by the compensation circuit is denoted by the above-mentioned Formula (26).

The compensating circuit may otherwise preferably serve as a current supply circuit for supplying a first current and a second current to the first transistor and the second transistor, respectively, the first current and the second current satisfying a ratio of Rf/Rref:1 where Rf expresses the resistance of each feedback resistor and Rref expresses the resistance of the reference resistor.

The photoreceiver/amplifier circuit preferably further comprises: an active load including a first load transistor connected to the first transistor in series, and a second load transistor connected to the second transistor in series, wherein: the compensating circuit has a first resistor provided between an emitter of the first load transistor and a power supply potential, and a second resistor provided between an emitter of the second load transistor and the power supply potential, and the first and second resistors have resistances which are set to values for enabling collector currents of the first and second transistors to compensate a voltage difference derived from a resistance difference between the feedback resistor and the reference resistor.

With this arrangement, the compensation circuit includes the first and second resistors respectively connected to the first and second transistors of the active load in series.

To compensate the voltage difference due to the difference between the resistance of the feedback resistor and the resistance of the reference resistor (satisfy the Formula (54) shown later), it is necessary to adjust the collector currents in the first transistor and in the first load transistor and the collector currents in the second transistor and in the second load transistor (satisfy the Formula (55) shown later). Since the collector currents respectively flow in the first and second resistors, appropriate setting of the resistances of the first and second resistors (satisfy the Formula (56) shown later) compensates the voltage difference, thereby preventing an offset voltage.

Another photoreceiver/amplifier circuit comprises: a plurality of optical receivers for receiving light beams of different wavelengths; a plurality of feedback resistors corresponding to light beams of different wavelengths; a plurality of reference resistors corresponding to the feedback resistors; a plurality of differential circuits each including a differential transistor pair made up of a corresponding pair of (i) one of a plurality of first transistors each having a base connected to one of the optical receivers and one of the feedback resistors, and (ii) one of a plurality of second transistors each having a base supplied with an external reference potential via one of the reference resistors; a first selecting circuit for selectively driving one of the differential circuits; a plurality of compensating circuits for compensating a difference between a voltage between terminals of each feedback resistor and a voltage between terminals of a corresponding reference resistor; and a second selecting circuit for selectively driving one of the compensating circuits corresponding to a differential circuit selected by the first selecting circuit, wherein: a resistance of each feedback resistor is greater than a resistance of each reference resistor.

With this arrangement in which a resistance of each feedback resistor is greater than a resistance of a corresponding reference resistor, the noise from a low-frequency band can be securely reduced as with the foregoing photoreceiver/amplifier circuit. Besides, as the second selecting circuit selectively driving one of the compensating circuits corresponding to a differential circuit selected by the first selecting circuit, the compensation circuit compensates a difference between the voltage between terminals of the feedback resistor and a voltage between terminals of the reference resistor as with the foregoing photoreceiver/amplifier circuit. Therefore, it is possible to prevent an offset voltage caused by the difference between the resistance of the feedback resistor and the resistance of the reference resistor. Consequently, noise reduction and improvement of offset characteristic can be ensured according to gain switching for each of the plural optical receivers.

Also in this photoreceiver/amplifier circuit, each compensating circuit preferably serves as a current source for supplying a compensation current to a junction between the reference resistor and the base of the second transistor, for compensating the difference. The compensation current supplied by the compensation circuit is denoted by the above-mentioned Formulas (38) and (39).

Otherwise, in this photoreceiver/amplifier circuit, each compensating circuit preferably serves as a current source for supplying a compensation current to a junction between the feedback resistor and the base of the first transistor, for compensating the difference. The compensation current supplied by the compensation circuit is denoted by the above-mentioned Formulas (40) and (41).

Another photoreceiver/amplifier circuit comprises: a plurality of optical receivers for receiving light beams of different wavelengths; a plurality of feedback resistors corresponding to light beams of different wavelengths; a single common reference resistor for the feedback resistors; a plurality of differential circuits each including a differential transistor pair made up of a corresponding pair of (i) one of a plurality of first transistors each having a base connected to one of the optical receivers and one of the feedback resistors, and (ii) one of a plurality of second transistors each having a base supplied with an external reference potential via the reference resistor; a first selecting circuit for selectively driving one of the differential circuits; a plurality of compensating circuits for compensating a difference between a voltage between terminals of each feedback resistor and a voltage between terminals of the reference resistor; and a second selecting circuit for selectively driving one of the compensating circuits corresponding to a differential circuit selected by the first selecting circuit, wherein: a resistance of each feedback resistor is greater than a resistance of the reference resistor.

With this arrangement in which a resistance of each feedback resistor is greater than a resistance of a corresponding reference resistor, the noise from a low-frequency band can be securely reduced as with the foregoing photoreceiver/amplifier circuit. Besides, as the second selecting circuit selectively driving one of the compensating circuits corresponding to a differential circuit selected by the first selecting circuit, the compensation circuit compensates a difference between the voltage between terminals of the feedback resistor and a voltage between terminals of the reference resistor as with the foregoing photoreceiver/amplifier circuit. Therefore, it is possible to prevent an offset voltage caused by the difference between the resistance of the feedback resistor and the resistance of the reference resistor. Consequently, noise reduction and improvement of offset characteristic can be ensured according to gain switching for each of the plural optical receivers.

Also in this photoreceiver/amplifier circuit, the compensating circuit preferably serves as a current source for supplying a compensation current to a junction between the reference resistor and the base of the second transistor, for compensating the difference. The compensation current supplied by the compensation circuit is denoted by the above-mentioned Formulas (45) and (46).

Another photoreceiver/amplifier circuit comprises: a single optical receiver; a plurality of feedback resistors; a single common reference resistor for the feedback resistors; a differential circuit including a differential transistor pair made up of a first transistor having a base connected to the optical receiver and one of the feedback resistors, and a second transistor having a base supplied with an external reference potential via the reference resistor; a first selecting circuit for selectively connecting one of the feedback resistors to the differential circuit; a plurality of compensating circuits for compensating a difference between a voltage between terminals of each feedback resistor and a voltage between terminals of the reference resistor; and a second selecting circuit for selectively driving one of the compensating circuits corresponding to a feedback circuit selected by the first selecting circuit, wherein: a resistance of each feedback resistor is greater than a resistance of the reference resistor.

With this arrangement in which a resistance of each feedback resistor is greater than a resistance of a corresponding reference resistor, the noise from a low-frequency band can be securely reduced as with the foregoing photoreceiver/amplifier circuit. Besides, as the second selecting circuit selectively driving one of the compensating circuits corresponding to a feedback circuit selected by the first selecting circuit, the compensation circuit compensates a difference between the voltage between terminals of the feedback resistor and a voltage between terminals of the reference resistor as with the foregoing photoreceiver/amplifier circuit. Therefore, it is possible to prevent an offset voltage caused by the difference between the resistance of the feedback resistor and the resistance of the reference resistor. Consequently, noise reduction and improvement of offset characteristic can be ensured according to gain switching for each of the plural feedback resistors.

Another photoreceiver/amplifier circuit comprises: a plurality of optical receivers for receiving light beams of different wavelengths; a plurality of feedback resistors corresponding to light beams of different wavelengths; a plurality of reference resistors corresponding to the feedback resistors; a plurality of differential circuits each including a differential transistor pair made up of a corresponding pair of (i) one of a plurality of first transistors each having a base connected to one of the optical receivers and one of the feedback resistors, and (ii) one of a plurality of second transistors each having a base supplied with an external reference potential via one of the reference resistors; a selecting circuit for selectively driving one of the differential circuits; a compensating circuit for compensating a difference between a voltage between terminals of each feedback resistor and a voltage between terminals of a corresponding reference resistor, wherein: the compensating circuit has a first resistor provided between an emitter of the first load transistor and a power supply potential, and a second resistor provided between an emitter of the second load transistor and the power supply potential, and the first and second resistors have resistances which are set to values for enabling collector currents of the first and second transistors to compensate a voltage difference derived from a resistance difference between the feedback resistor and the reference resistor, a resistance of each feedback resistor is greater than a resistance of a corresponding reference resistor, and these resistances are set so that the difference between a voltage between terminals of each feedback resistor and a voltage between terminals of a corresponding reference resistor becomes constant.

With this arrangement in which a resistance of each feedback resistor is greater than a resistance of the reference resistor, the noise from a low-frequency band can be securely reduced as with the foregoing photoreceiver/amplifier circuit. Further, the compensation circuit includes the first and second resistors respectively connected to the first and second transistors of the active load in series. To compensate the voltage difference due to the difference between the resistance of the feedback resistor and the resistance of the reference resistor (satisfy the above-mentioned Formula (57)), it is necessary to adjust the collector currents in the first transistor and in the first load transistor and the collector currents in the second transistor and in the second load transistor (satisfy the above-mentioned Formula (58)). Since the collector currents respectively flow in the first and second resistors, appropriate setting of the resistances of the first and second resistors (satisfy the above-mentioned Formula (60)) compensates the voltage difference, thereby preventing an offset voltage. Consequently, noise reduction and improvement of offset characteristic can be ensured according to gain switching for each of the plural feedback resistors.

Moreover, in this photoreceiver/amplifier circuit, the resistances of the feedback resistor and the reference resistor are set so that the difference between a voltage between terminals of each feedback resistor and a voltage between terminals of a corresponding reference resistor becomes constant. Such usage of the common first and second resistors gives an effect of improving offset characteristics of each feedback resistor and each reference resistor. Further, it is not necessary to provide individual first and second resistors for each feedback resistor and each reference resistor, and therefore the circuit layout will not become complicated.

An optical pickup device according to the present invention includes the photoreceiver/amplifier circuit having the foregoing structure, and therefore ensures noise reduction and improved offset voltage characteristic in a photoreceiver/amplifier circuit. With this advantage, particularly when converting reflection light from an optical disk into a signal voltage, the optical pickup device improves qualities of output signals. Further, an optical disk device according to the present invention includes the optical pickup device, and therefore improves qualities of output signals in the same manner.

The described photoreceiver/amplifier circuit includes a compensating circuit for compensating a difference between a voltage between terminals of each feedback resistor and a voltage between terminals of a corresponding reference resistor, and a resistance of the feedback resistor is greater than a resistance of the reference resistor. Therefore, it is possible to prevent an offset voltage caused by the difference between the resistance of the feedback resistor and the resistance of the reference resistor.

On this account, the photoreceiver/amplifier circuit ensures noise reduction and improved offset voltage characteristic. Accordingly, the quality of the output voltage of a photoreceiver/amplifier circuit can be improved. Moreover, when provided in an optical pickup device, the photoreceiver/amplifier circuit improves reliability of the optical pickup device and an optical disk device using the optical pickup device.

Each of the described photoreceiver/amplifier circuit thus ensures noise reduction and improved offset voltage characteristic, and therefore is useful for an optical pickup device for carrying out recording and reproduction of information into optical disks.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:
1. A photoreceiver/amplifier circuit comprising:
   an optical receiver;
   a feedback resistor;
   a reference resistor;
   a differential circuit including a differential transistor pair made up of a first transistor having a base connected to the optical receiver and to the feedback resistor, and a second transistor having a base supplied with an external reference potential via the reference resistor; and compensating means for compensating a difference between voltage between terminals of the feedback resistor and a voltage between terminals of the reference resistor, wherein a resistance of the feedback resistor is greater than a resistance of the reference resistor, and wherein the compensating means serves as a current source for supplying a compensation current to a junction between the reference resistor and the base of the second transistor, for compensating the difference.

2. The photoreceiver/amplifier circuit as set forth in claim 1, wherein the compensation current is expressed as:

(Rf/Rref−1)×Ib where Rf expresses the resistance of the feedback resistor, Rref expresses the resistance of the reference resistor, and Ib expresses a base current of the second transistor.

3. A photoreceiver/amplifier circuit comprising:
an optical receiver;
a feedback resistor;
a reference resistor;
a differential circuit including a differential transistor pair made up of a first transistor having a base connected to the optical receiver and to the feedback resistor, and a second transistor having a base supplied with an external reference potential via the reference resistor; and
compensating means for compensating a difference between voltage between terminals of the feedback resistor and a voltage between terminals of the reference resistor,
wherein a resistance of the feedback resistor is greater than a resistance of the reference resistor, and
wherein the compensating means serves as a current source for supplying a compensation current to a junction between the feedback resistor and the base of the first transistor, for compensating the difference.

4. The photoreceiver/amplifier circuit as set forth in claim 3, wherein the compensation current is expressed as:

(1−Rref/Rf)×Ib where Rf expresses the resistance of the feedback resistor, Rref expresses the resistance of the reference resistor, and Ib expresses a base current of the first transistor.

5. A photoreceiver/amplifier circuit comprising:
an optical receiver;
a feedback resistor;
a reference resistor;
a differential circuit including a differential transistor pair made up of a first transistor having a base connected to the optical receiver and to the feedback resistor, and a second transistor having a base supplied with an external reference potential via the reference resistor; and
compensating means for compensating a difference between voltage between terminals of the feedback resistor and a voltage between terminals of the reference resistor,
wherein a resistance of the feedback resistor is greater than a resistance of the reference resistor, and
wherein the compensating means comprises:
a current mirror circuit;
a third transistor for supplying a bias current whose magnitude is equal to a value obtained by multiplying a bias current for driving the differential transistor pair by a 1/2 ratio of the resistance of the feedback resistor to the resistance of the reference resistor;
a fourth transistor having an emitter connected to a collector of the third transistor, and a base connected to an input terminal of the current mirror circuit; and
a fifth transistor for supplying a bias current whose magnitude is ½ of the bias current for driving the differential transistor pair, and having a base connected to an output terminal of the current mirror circuit.

6. A photoreceiver/amplifier circuit comprising:
an optical receiver;
a feedback resistor;
a reference resistor;
a differential circuit including a differential transistor pair made up of a first transistor having a base connected to the optical receiver and to the feedback resistor, and a second transistor having a base supplied with an external reference potential via the reference resistor; and
compensating means for compensating a difference between voltage between terminals of the feedback resistor and a voltage between terminals of the reference resistor,
wherein a resistance of the feedback resistor is greater than a resistance of the reference resistor, and
wherein the compensating means comprises:
a current mirror circuit;
a third transistor for supplying a bias current whose magnitude is ½ of a bias current for driving the differential transistor pair;
a fourth transistor connected to an input terminal of the current mirror circuit, and comprising an emitter connected to a collector of the third transistor; and
a fifth transistor for supplying a bias current whose magnitude is equal to a value obtained by multiplying the bias current for driving the differential transistor pair by a 1/2 ratio of the resistance of the feedback resistor to the resistance of the reference resistor, and having a base connected to an output terminal of the current mirror circuit.

7. A photoreceiver/amplifier circuit comprising:
an optical receiver;
a feedback resistor;
a reference resistor;
a differential circuit including a differential transistor pair made up of a first transistor having a base connected to the optical receiver and to the feedback resistor, and a second transistor having a base supplied with an external reference potential via the reference resistor; and
compensating means for compensating a difference between voltage between terminals of the feedback resistor and a voltage between terminals of the reference resistor,
wherein a resistance of the feedback resistor is greater than a resistance of the reference resistor, and
wherein the compensating means serves as a current supply circuit for supplying a first current and a second current to the first transistor and the second transistor, respectively, the first current and the second current satisfying a ratio of Rf/Rref:1 where Rf expresses the resistance of each feedback resistor and Rref expresses the resistance of the reference resistor.

8. A photoreceiver/amplifier circuit comprising:
an optical receiver;
a feedback resistor;
a reference resistor;
a differential circuit including a differential transistor pair made up of a first transistor having a base connected to the optical receiver and to the feedback resistor, and a second transistor having a base supplied with an external reference potential via the reference resistor;

compensating means for compensating a difference between voltage between terminals of the feedback resistor and a voltage between terminals of the reference resistor, and an active load including a first load transistor connected to the first transistor in series, and a second load transistor connected to the second transistor in series, wherein:

a resistance of the feedback resistor is greater than a resistance of the reference resistor, and the compensating means has a first resistor provided between an emitter of the first load transistor and a power supply potential, and a second resistor provided between an emitter of the second load transistor and the power supply potential, and the first and second resistors have resistances which are set to values for enabling collector currents of the first and second transistors to compensate a voltage difference derived from a resistance difference between the feedback resistor and the reference resistor.

9. An optical pickup device including the photoreceiver/amplifier circuit as set forth in any one of claims 1-6, 7, or 8.

10. An optical disk device including the optical pickup device as set forth in claim 9.

* * * * *